US012543328B2

(12) United States Patent
Lan et al.

(10) Patent No.: US 12,543,328 B2
(45) Date of Patent: Feb. 3, 2026

(54) INDUCTIVE DEVICE STRUCTURE AND PROCESS METHOD

(71) Applicant: QUALCOMM Incorporated, San Diego, CA (US)

(72) Inventors: Je-Hsiung Lan, San Diego, CA (US); Jonghae Kim, San Diego, CA (US); Jui-Yi Chiu, Taichung (TW); Kai Liu, Phoenix, AZ (US); Nosun Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 622 days.

(21) Appl. No.: 17/951,839

(22) Filed: Sep. 23, 2022

(65) Prior Publication Data
US 2024/0105760 A1    Mar. 28, 2024

(51) Int. Cl.
H10D 1/20    (2025.01)
H01F 27/24   (2006.01)
H01F 27/28   (2006.01)
H01F 41/04   (2006.01)
H01L 25/16   (2023.01)
H01L 25/18   (2023.01)
H10D 86/85   (2025.01)

(52) U.S. Cl.
CPC ............ H10D 1/20 (2025.01); H01F 27/24 (2013.01); H01F 27/2804 (2013.01); H01F 41/042 (2013.01); H01F 41/043 (2013.01); H01L 25/16 (2013.01); H01L 25/18 (2013.01); H10D 86/85 (2025.01)

(58) Field of Classification Search
CPC .................. H01L 23/64; H01L 23/66
See application file for complete search history.

(56) References Cited

U.S. PATENT DOCUMENTS

| | | | | |
|---|---|---|---|---|
| 5,844,299 A | * | 12/1998 | Merrill | H10D 1/20 257/E21.022 |
| 6,492,708 B2 | * | 12/2002 | Acosta | H10D 84/00 257/422 |
| 7,271,086 B2 | * | 9/2007 | Tang | H01L 24/12 257/E21.59 |
| 7,612,428 B2 | * | 11/2009 | Park | H01L 23/5227 257/531 |
| 8,405,199 B2 | * | 3/2013 | Lu | H01L 24/13 257/692 |
| 9,245,833 B2 | * | 1/2016 | Chen | H01L 24/03 |

(Continued)

FOREIGN PATENT DOCUMENTS

| | | |
|---|---|---|
| CN | 105514047 A | 4/2016 |
| WO | 2021236398 A1 | 11/2021 |

OTHER PUBLICATIONS

International Search Report and Written Opinion—PCT/US2023/029249—ISA/EPO—Nov. 27, 2023.

(Continued)

*Primary Examiner* — Dale E Page
*Assistant Examiner* — Rohit Parthasarathy
(74) *Attorney, Agent, or Firm* — Seyfarth Shaw LLP

(57) ABSTRACT

A device is described. The device includes a substrate having a first cavity. The device also includes a first redistribution layer (RDL) on sidewalls and a base of the first cavity in the substrate and on a first surface of the substrate. The device further includes a fill material in the first cavity.

11 Claims, 19 Drawing Sheets

(56) References Cited

U.S. PATENT DOCUMENTS

| | | | | |
|---|---|---|---|---|
| 9,306,537 | B1* | 4/2016 | Gubser | H03H 9/0547 |
| 2006/0192267 | A1* | 8/2006 | Park | H01L 23/5227 |
| | | | | 257/E21.573 |
| 2006/0252225 | A1* | 11/2006 | Gambee | H01L 21/31133 |
| | | | | 257/E21.309 |
| 2007/0210866 | A1* | 9/2007 | Sato | H03F 3/72 |
| | | | | 330/126 |
| 2011/0101523 | A1* | 5/2011 | Hwang | H01L 24/16 |
| | | | | 257/737 |
| 2016/0260695 | A1* | 9/2016 | Chung | H01L 23/34 |
| 2016/0343809 | A1* | 11/2016 | Green | H10D 62/8503 |
| 2021/0082890 | A1* | 3/2021 | Kim | H01L 23/5389 |
| 2021/0210452 | A1* | 7/2021 | Langari | H01L 23/49827 |
| 2021/0281234 | A1* | 9/2021 | Kim | H01L 23/66 |
| 2022/0085143 | A1* | 3/2022 | Choi | H01F 27/2866 |
| 2023/0212773 | A1* | 7/2023 | Oberst | C25D 5/10 |
| | | | | 205/123 |
| 2024/0006308 | A1* | 1/2024 | Liu | H01L 23/5227 |
| 2024/0105760 | A1* | 3/2024 | Lan | H01L 25/16 |
| 2025/0120102 | A1* | 4/2025 | Marin | H01L 23/5384 |

OTHER PUBLICATIONS

Khoo Y M., et al., "Enhancement of Silicon-Based Inductor Q-Factor Using Polymer Cavity", IEEE Transactions on Components, Packaging and Manufacturing Technology, IEEE, USA, vol. 2, No. 12, Dec. 1, 2012, pp. 1973-1979, XP011476114, Paragraphs I., IV. ("Inductor Design"), V. ("Fabrication, Process") with Figures 3, 11 and 12.

* cited by examiner

INDUCTIVE DEVICE STRUCTURE AND PROCESS METHOD

BACKGROUND

Field

Aspects of the present disclosure relate to semiconductor devices and, more particularly, to a high-quality (Q) and high-density inductive device structure and process method.

Background

Wireless communications devices incorporate radio frequency (RF) modules that facilitate the communication and features users expect. As wireless systems become more prevalent and include more capabilities, the chips become more complex. Fifth generation (5G) new radio (NR) and sixth generation (6G) wireless communications devices incorporate the latest generation of electronic dies that are packed into smaller modules with smaller interconnections. Design challenges include integrating passive devices and active devices to implement RF front-end (RFFE) modules.

An RFFE module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, these conventional side-by-side on package laminate configurations may not work well in a reduced form factor of future applications. An RFFE implementation that meets the reduced form factor of future RFFE module applications is desired.

SUMMARY

A device is described. The device includes a substrate having a first cavity. The device also includes a first redistribution layer (RDL) on sidewalls and a base of the first cavity in the substrate and on a first surface of the substrate. The device further includes a fill material in the first cavity.

A method for fabricating a device is described. The method includes forming a first cavity in a substrate. The method also includes depositing a first seed layer on sidewalls and a base of the first cavity and on a first surface of the substrate. The method further includes depositing a photoresist material on the first surface and in the first cavity in the substrate. The method also includes exposing the photoresist material on the first surface and in the first cavity in the substrate to form a first redistribution layer (RDL) mask. The method further includes depositing a first conductive material according to the first RDL mask to form a first redistribution layer (RDL) on the sidewalls and the base of the first cavity in the substrate and on the first surface of the substrate. The method also includes filling the first cavity in the substrate with a fill material.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
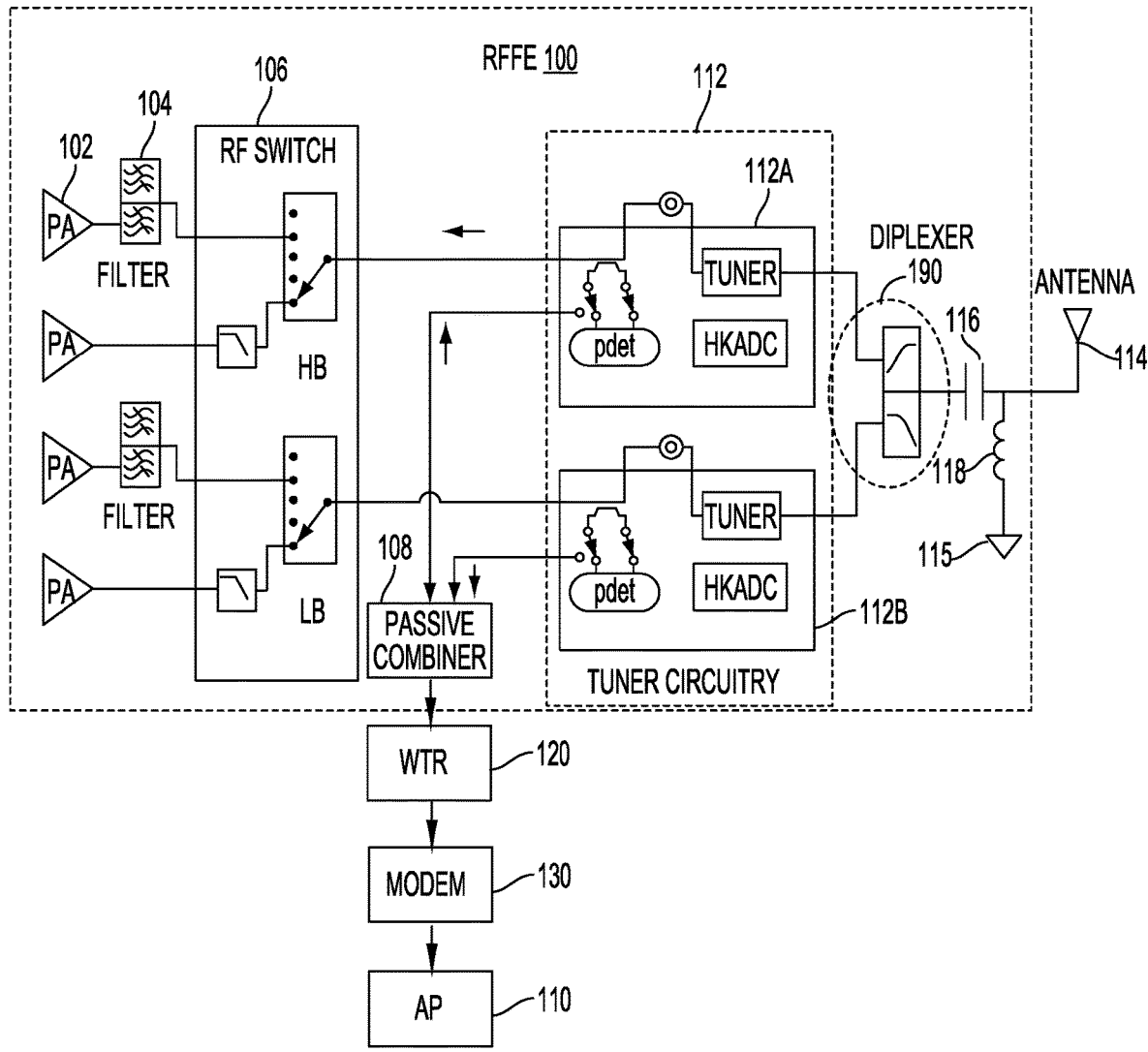
FIG. 1 is a schematic diagram of a radio frequency front-end (RFFE) module employing an inductive device structure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Wireless communications devices incorporate radio frequency (RF) modules that facilitate the communication and features users expect. As wireless systems become more prevalent and include more capabilities, the chips become more complex. For example, mobile RF chips (e.g., mobile RF transceivers) have migrated to a deep sub-micron process node due to cost and power consumption considerations. Designing mobile RF transceivers is complicated by added circuit functions for supporting communications enhancements, such as fifth generation (5G) new radio (NR) communications systems. In particular, 5G NR wireless communications devices incorporate the latest generation of electronic dies that are packed into smaller modules with smaller interconnections. Design challenges include integrating passive devices and active devices to implement RF front-end modules (FEMs).

RF filters in mobile RF transceivers may include high performance capacitor and inductor components. For example, RF filters use various types of passive devices, such as integrated capacitors and integrated inductors. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at millimeter wave (mmW) frequencies (e.g., frequency range two (FR2)).

A radio frequency (RF) front-end (RFFE) module may include a high performance RF filter including inductors and transformers. In practice, an RFFE module may be implemented by integrating RF filters, active devices, and surface-mount technology (SMT) devices on a laminate substrate. These RF filters, active devices, and SMT devices are conventionally arranged in a side-by-side package configuration supported by a laminate substrate. Unfortunately, this conventional side-by-side on package laminate configuration may not fit within a reduced form factor of future RF applications. That is, the conventional side-by-side on package laminate configurations may exceed the form factor of future RFFE module applications. An RFFE implementation that meets the reduced form factor specified by future RFFE module applications is desired.

In particular, a high performance RF filter is desirable for 5G/6G RFFE applications. In addition, a high-quality (Q) inductor is favorable for high performance filters. A high-density inductor is also desirable for compact filter chip design. These high-Q/compact inductors are specified for a transmit (TX) filter with high power handling capability. All above-mentioned favorable features are desirable to achieve a two-dimensional (2D) integrated passive device (IPD). A three-dimensional (3D) through glass via (TGV) process can offer a higher Q-factor and higher density inductors than the conventional 2D process. Nevertheless, the 3D TGV process involves a double-sided redistribution layer (RDL) and polyimide (PI) interlayer dielectric (ILD) processes, which are more expensive, and involve bonding/de-bonding temporary carriers and related processes when a thin TGV substrate is specified.

Various aspects of the present disclosure provide a high-quality (Q) and high-density inductive device structure. The process flow for fabrication of the inductive device structure may include wafer-level processes, such as front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers. The BEOL vias may also provide a via pad (VP) to support package (or device) interconnects, such as package balls.

Some aspects of the present disclosure are directed to inductive device structures, including a redistribution layer (RDL) on a surface and in a cavity of a substrate. In some aspects of the present disclosure, the substrate is composed of a blind cavity alumina (BCA) substrate, supporting an RDL formed by depositing a thick copper layer directly built on the BCA substrate with high thermal conductivity. In these aspects of the present disclosure, the inductive device structure enables formation of an inductor having both a higher Q-factor and inductance density to support a higher power handling capability when implemented in integrated passive device (IPD) filters. According to aspects of the present disclosure, an RFFE module includes an IPD filter implemented using the inductive device structure.

In some aspects of the present disclosure, the inductive device structure supports formation of a transformer built on both sides of the cavity and having a higher coupling factor and a higher coupling efficiency. Some aspects of the present disclosure enhance the inductive device structure performance by applying a magnetic paste material and filling the cavity to increase inductance, Q-factor, and density. A single-sided process of fabricating the inductive device structure may combine a thick photoresist with a two-step photolithography scheme that offers a lower cost advantage than the conventional TGV process.

FIG. 1 is a schematic diagram of a radio frequency front-end (RFFE) module 100 employing an inductive device structure, according to aspects of the present disclosure. The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118, and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 110. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
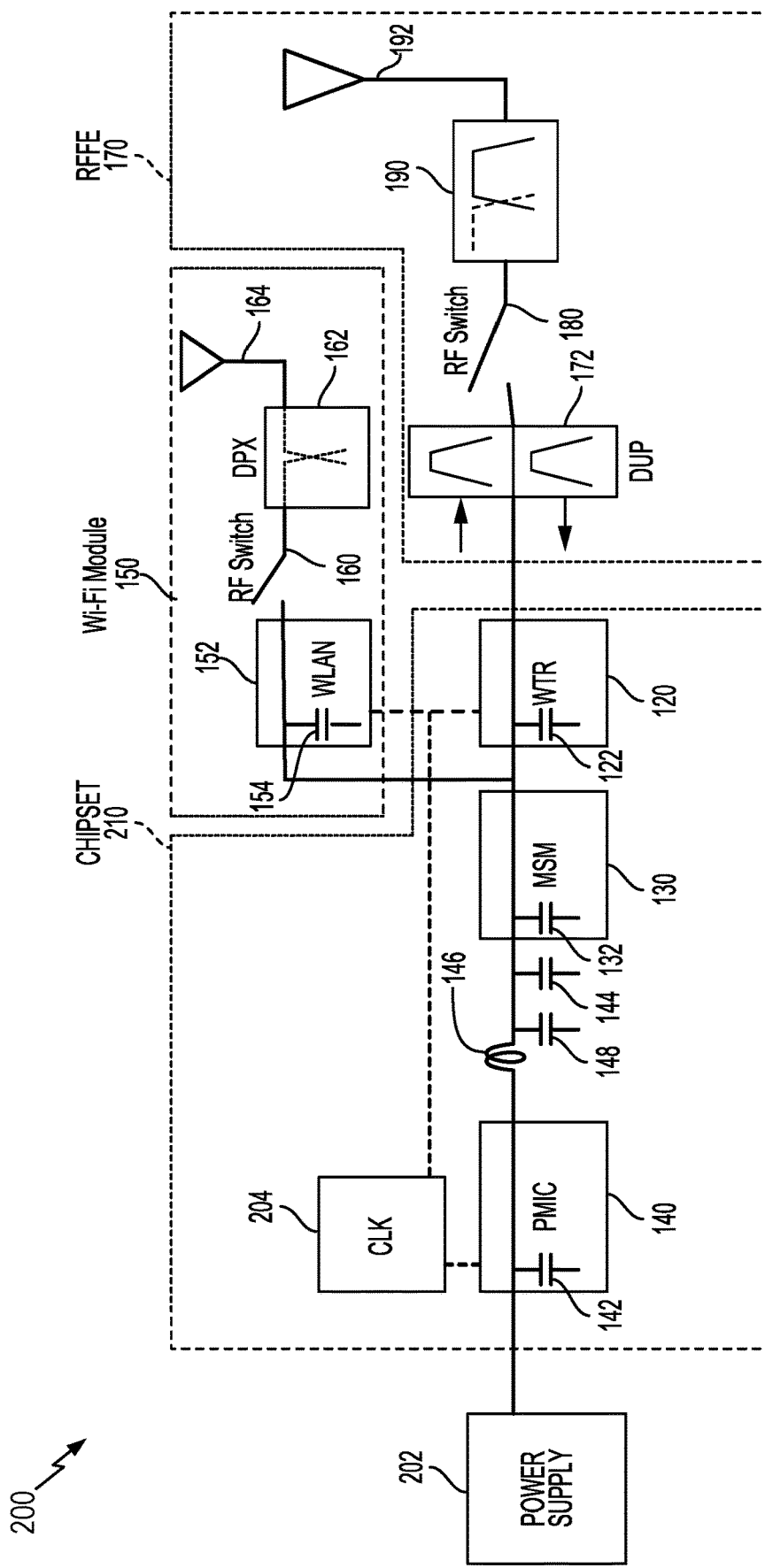
FIG. 2 is a schematic diagram of a radio frequency integrated circuit (RFIC) employing active and passive devices for a chipset.

FIG. 2 is a schematic diagram of a radio frequency integrated circuit (RFIC) chip 200, having a wireless local area network (WLAN) (e.g., Wi-Fi) module 150 and a radio frequency front-end (RFFE) module 170 for a chipset 210. The Wi-Fi module 150 includes a first diplexer 162 communicably coupling an antenna 164 to a WLAN module 152. A first RF switch 160 communicably couples the first diplexer 162 to the WLAN module 152. The RFFE module 170 includes a second diplexer 190 communicably coupling an antenna 192 to a wireless transceiver (WTR) 120 through a duplexer 172. A second RF switch 180 communicably couples the second diplexer 190 to the duplexer 172.

The WTR 120 and the WLAN module 152 of the Wi-Fi module 150 are coupled to a modem (mobile station modem (MSM), e.g., baseband modem) 130 that is powered by a power supply 202 through a power management integrated circuit (PMIC) 140. The chipset 210 also includes capacitors 144 and 148, as well as an inductor(s) 146 to provide signal integrity. The PMIC 140, the modem 130, the WTR 120, and the WLAN module 152 each include capacitors (e.g., 142, 132, 122, and 154) and operate according to a clock 204. In addition, the inductor 146 couples the modem 130 to the PMIC 140. The geometry and arrangement of the various inductor and capacitor components in the RFIC) chip 200 may reduce the electromagnetic coupling between the components.

The WTR 120 of the wireless device generally includes a mobile RF transceiver to transmit and receive data for two-way communications. The WTR 120 and the RFFE module 170 may be implemented using high performance complementary metal oxide semiconductor (CMOS) RF switch technologies to implement switch transistors of the first RF switch 160 and the second RF switch 180. The RFFE module 170 may rely on these high performance CMOS RF switch technologies to implement an active die for successful operation. In practice, the active die used to implement the CMOS RF switch technology may involve integration with a passive RF filter to implement an antenna module, for example, as shown in FIG. 3.

Figure 3:
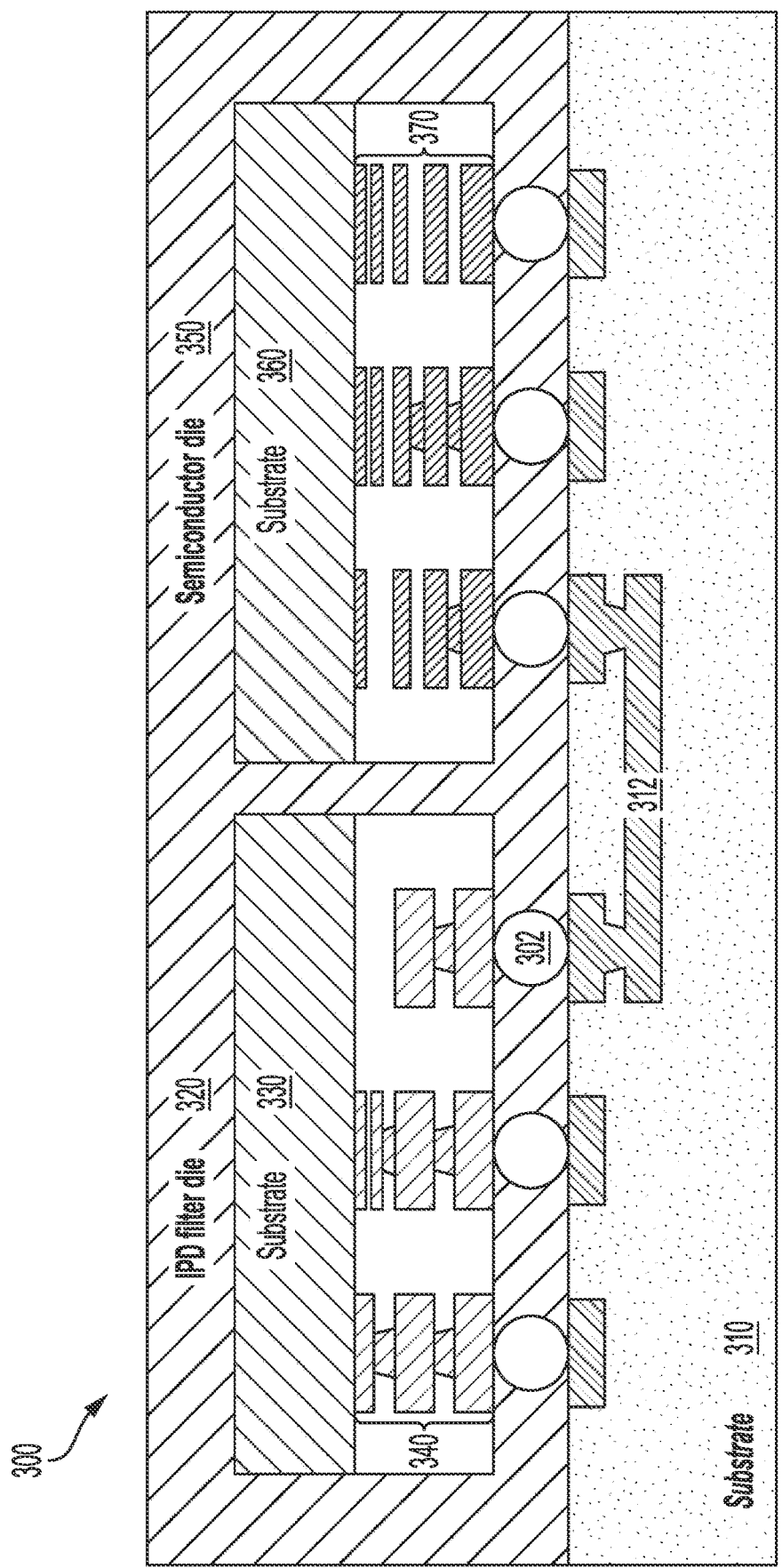
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300 including a semiconductor die and an integrated passive device (IPD) filter die, in accordance with aspects of the present disclosure. In this example, the RFFE module 300 includes a semiconductor die 350 and an IPD filter die 320 supported by a package substrate 310 (e.g., a laminate substrate). The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through BEOL layers 340. The redistribution layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. In practice, the RFFE module 300 integrates the IPD filter die 320, the semiconductor die 350, and surface-mount technology (SMT) devices on the package substrate 310 (e.g., laminate). The IPD filter die 320, the semiconductor die 350, and the SMT devices (not shown) are arranged in a side-by-side package configuration supported by the package substrate 310. Unfortunately, this side-by-side on package substrate configuration may not fit within the reduced form factor of future RF applications. That is, the conventional side-by-side on package laminate configurations may exceed the form factor of future RFFE module applications. An RFFE implementation that meets the reduced form factor of future RFFE module applications is shown, for example, in FIGS. 4A and 4B.

Figure 4A:
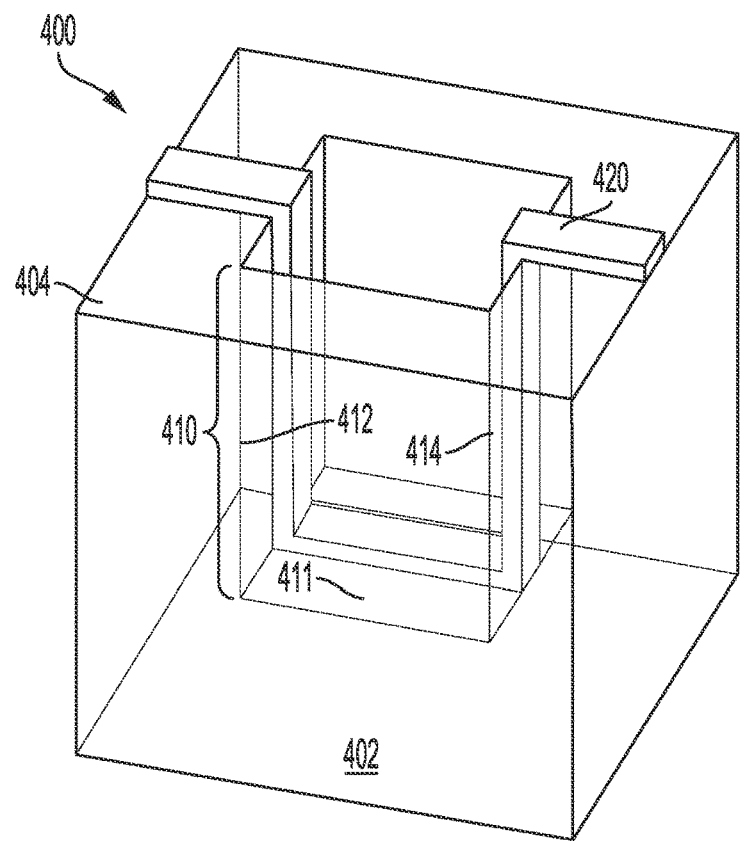
FIGS. 4A and 4B are block diagrams illustrating integrated passive devices (IPDs) formed from inductive device structures, according to aspects of the present disclosure.
Figure 4B:
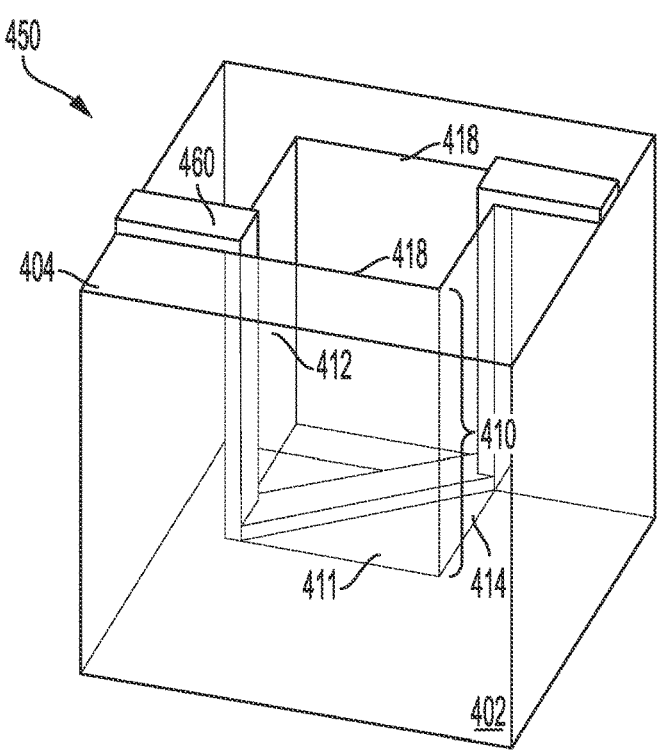

FIGS. 4A and 4B are block diagrams illustrating integrated passive devices (IPDs) formed from inductive device structures, according to aspects of the present disclosure. As shown in FIG. 4A, an integrated passive device (IPD) 400 includes a substrate 402 having blind cavity and can be composed of alumina, glass, high resistivity (HR) silicon, a laminate material, or preferably substrate with high thermal conductivity (TC). In some aspects of the present disclosure, the substrate 402 includes a cavity 410, in which an inductor 420 is formed on opposing sidewalls 412, 414 and a base 411 of the cavity 410, as well as a surface 404 of the substrate 402. In some aspects of the present disclosure, the substrate 402 is composed of a blind cavity alumina (BCA) substrate, supporting a first redistribution layer (RDL) formed by depositing a thick copper (Cu) layer directly built on the BCA substrate of the substrate 402 and the cavity 410.

As shown in FIG. 4B, an IPD 450 includes the substrate 402 having the cavity 410, in which an inductor 460 is formed, according to aspects of the present disclosure. In this example, the inductor 460 is also formed on the opposing sidewalls 412, 414 and the base 411 of the cavity 410, as well as the surface 404 of the substrate 402. In this aspect of the present disclosure, the inductor 460 is also formed on opposing sidewalls 416, 418 and extends between diagonal corners along the base 411 of the cavity 410. In this example, the inductor 460 is composed of an RDL formed by depositing a copper (Cu) layer directly on the substrate 402 and the cavity 410. This configuration of the inductor 460 provides a higher inductance and a higher Q-factor relative to the inductor 420 of FIG. 4A, which outperforms a conventional 2D inductor. The cavity 410 may be filled with a fill material to further improve a performance of the inductor 420 and the inductor 460.

Figure 5A:
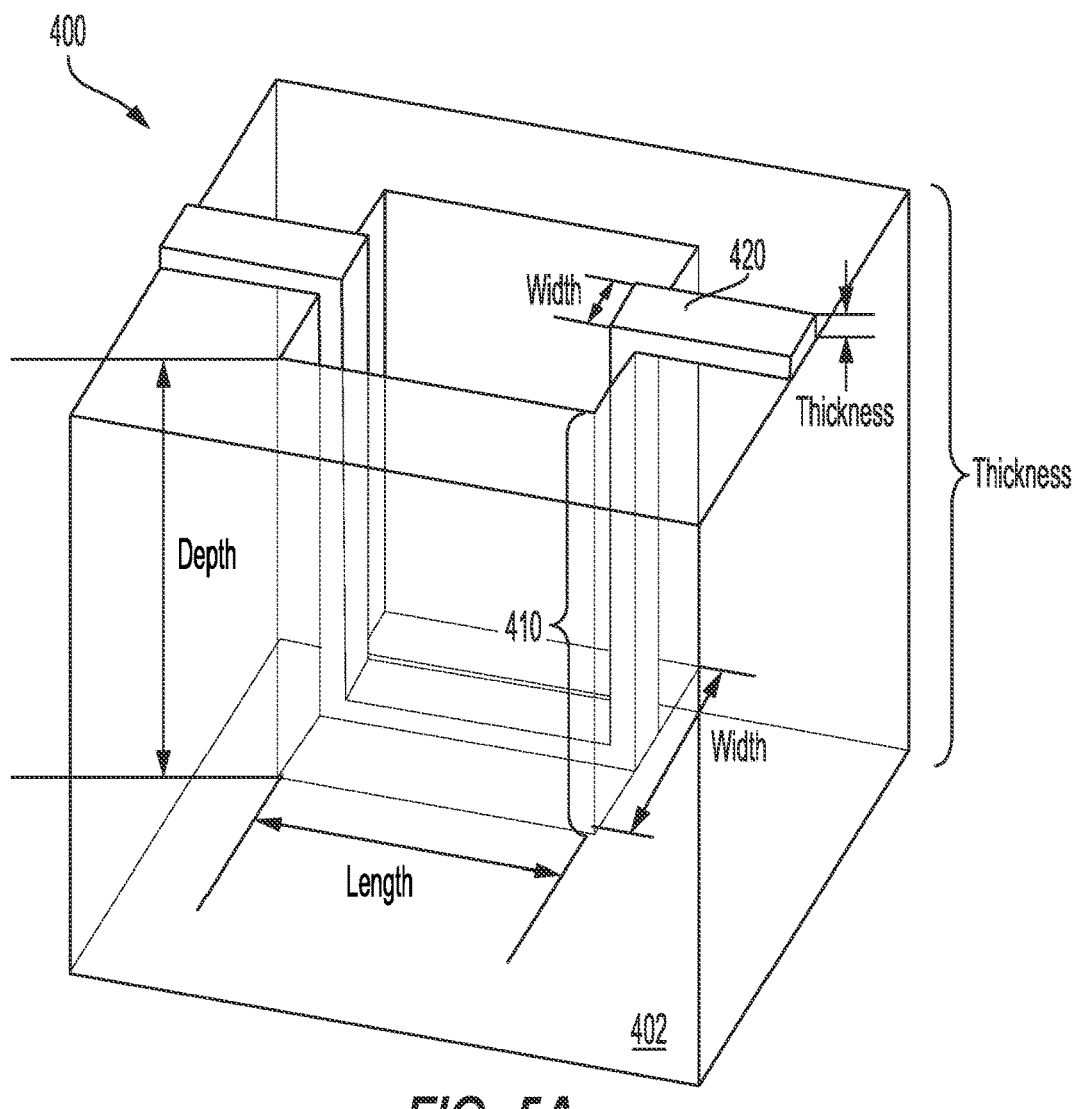
FIGS. 5A and 5B are block diagrams further illustrating the integrated passive device (IPD), including the inductive device structure of FIG. 4A, according to aspects of the present disclosure.
Figure 5B:
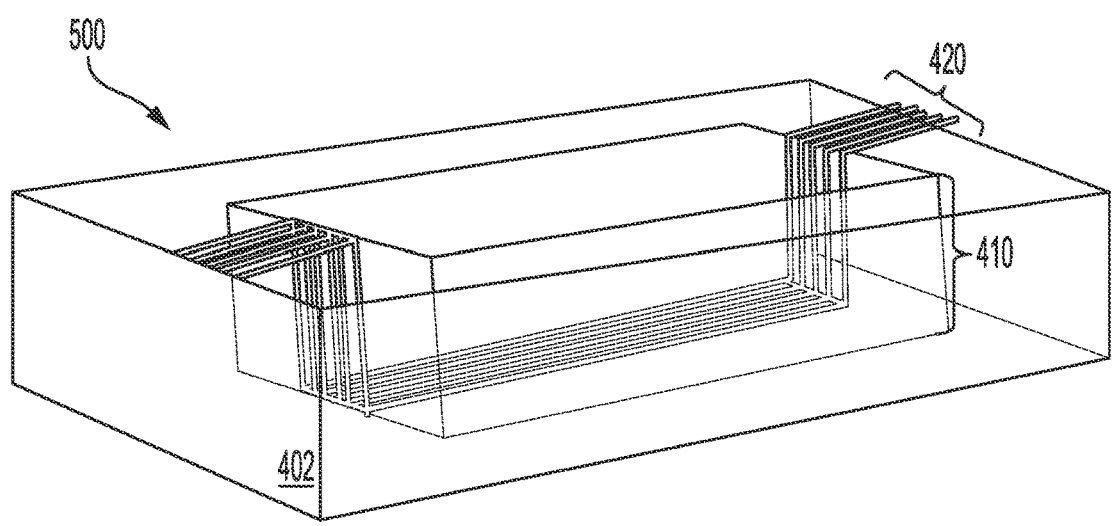

FIGS. 5A and 5B are block diagrams further illustrating the integrated passive device (IPD) 400, including the inductive device structure of FIG. 4A, according to aspects of the present disclosure. FIG. 5A illustrates the dimensions of the IPD 400, including the substrate 402, the cavity 410 in the substrate 402, and the inductor 420. In this example, the substrate 402 is shown with a thickness of approximately four-hundred (400) micrometers (microns) in which the cavity 410 is formed as a square, having a depth, a length, and a width of three-hundred (300) microns. In addition, the inductor 420 is shown having a redistribution layer (RDL) thickness of fifteen (15) microns and an RDL width of twenty (20) microns.

FIG. 5B illustrates a perspective view of an IPD 500 including the substrate 402, having the cavity 410, in which the inductor 420 is formed. As described, the cavity 410 may be referred to as a blind cavity, in which a portion of the inductor 420 within the cavity 410 is occluded by the substrate 402. In this example, the inductor 420 is a wire inductor formed by depositing an RDL of copper (Cu) within the cavity 410 and the surface 404 of the substrate 402. In these aspects of the present disclosure, the inductive device structure of the IPD 500 enables formation of the inductor 420 having both a higher Q-factor and inductance density to support a higher power handling capability when implemented in a radio frequency (RF) filter. The inductive device structure of the IPD 400 provides a significant size reduction (e.g., 20%-30%) as well as a lower cost (e.g., 30%) relative to a conventional 2D passive on glass (POG) wire inductor.

Figure 6A:
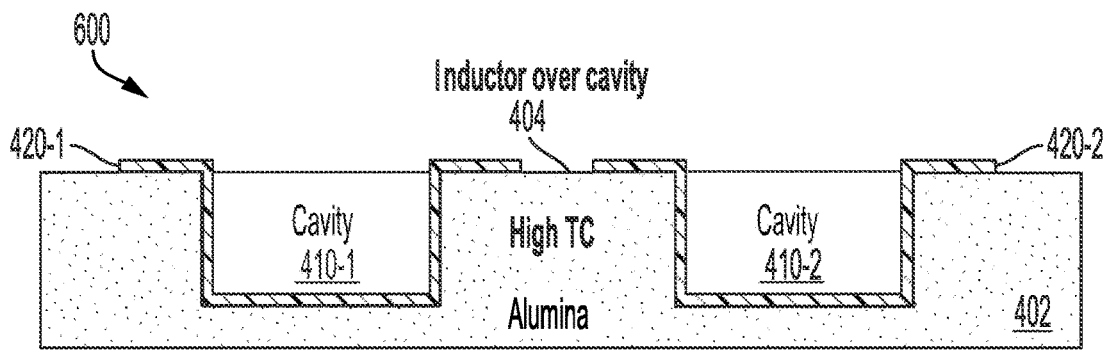
FIGS. 6A-6D are block diagrams illustrating integrated passive devices (IPDs) formed from inductive device structures, according to aspects of the present disclosure.

FIGS. 6A-6D are block diagrams illustrating integrated passive devices (IPDs) formed from inductive device structures, according to aspects of the present disclosure. As shown in FIG. 6A, an IPD 600 also includes the substrate 402 of FIG. 4A having a first cavity 410-1 in which a first inductor 420-1 is formed, as well as a surface 404 of the substrate 402. In addition, the substrate 402 includes a second cavity 410-2, in which a second inductor 420-2 is formed. In some aspects of the present disclosure, the first inductor 420-1 and the second inductor 420-2 are also composed of a redistribution layer (RDL) (e.g., copper (Cu)) built on the surface 404 of the substrate 402, the first cavity 410-1, and the second cavity 410-2. In this example, the substrate 402 is composed of a blind cavity alumina (BCA) substrate.

Figure 6B:
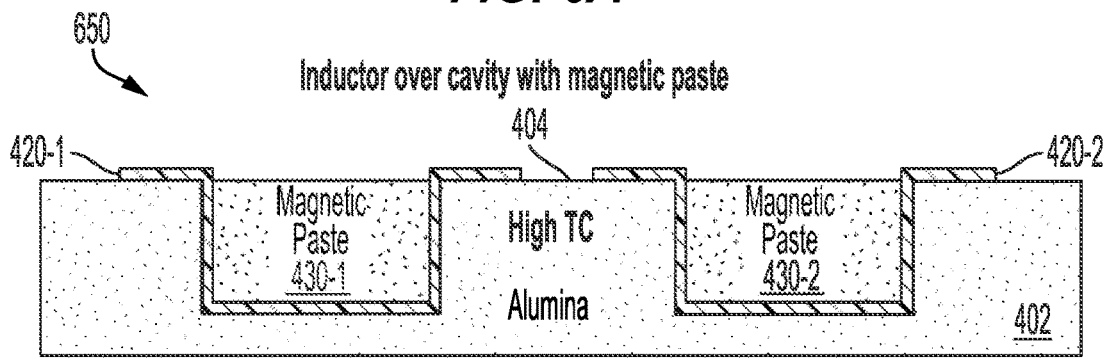

As shown in FIG. 6B, an IPD 650 also includes the substrate 402 having the first cavity 410-1, in which the first inductor 420-1 is formed, and the second cavity 410-2, in which the second inductor 420-2 is formed, as well as the surface 404 of the substrate 402. In this example, the first cavity 410-1 is filled with a first magnetic paste 430-1, and the second cavity 410-2 is filled with a second magnetic paste 430-2. In some aspects of the present disclosure, the first magnetic paste 430-1 and the second magnetic paste 430-2 are composed of magnetic paste material. The first inductor 420-1 and the second inductor 420-2 are also composed of an RDL formed by depositing a copper (Cu) layer directly built on the surface 404 of the substrate 402 as well as the first cavity 410-1 and the second cavity 410-2.

Figure 6C:
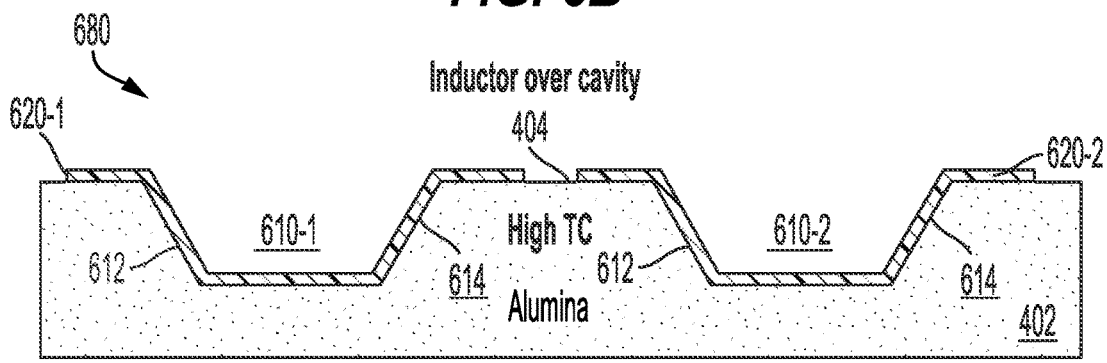

As shown in FIG. 6C, an IPD 680 also includes the substrate 402; however, the substrate 402 includes a first cavity 610-1 and a second cavity 610-2 having tapered sidewalls 612, 614. In this example, a first inductor 620-1 is formed on the tapered sidewalls 612, 614 of the first cavity 610-1 as well as the surface 404 of the substrate 402. In addition, a second inductor 620-2 is formed on the tapered sidewalls 612, 614 of the second cavity 610-2 as well as the surface 404 of the substrate 402. In this example, the first inductor 620-1 and the second inductor 620-2 are also composed of an RDL formed by depositing a copper (Cu) layer directly on the surface 404 of the substrate 402, the first cavity 610-1, and the second cavity 610-2.

Figure 6D:
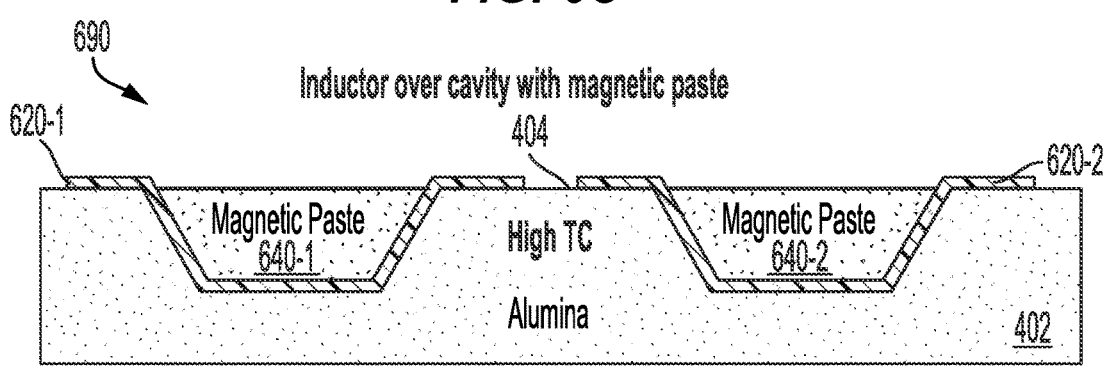

As shown in FIG. 6D, an IPD 690 also includes the substrate 402, including the first cavity 610-1 and the second cavity 610-2 having tapered sidewalls 612, 614. In this example, the first inductor 620-1 is formed on the tapered sidewalls 612, 614 of the first cavity 610-1 as well as the surface 404 of the substrate 402. In addition, the second inductor 620-2 is formed on the tapered sidewalls 612, 614 of the second cavity 610-2 as well as the surface 404 of the substrate 402. In this example, the first cavity 610-1 is filled with a first magnetic paste 640-1, and the second cavity 610-2 is filled with a second magnetic paste 640-2. In some aspects of the present disclosure, the first magnetic paste 640-1 and the second magnetic paste 640-2 are composed of magnetic paste material. The first inductor 620-1 and the second inductor 620-2 are also composed of an RDL built on the surface 404 of the substrate 402 as well as the first cavity 610-1 and the second cavity 610-2.

Figure 7A:
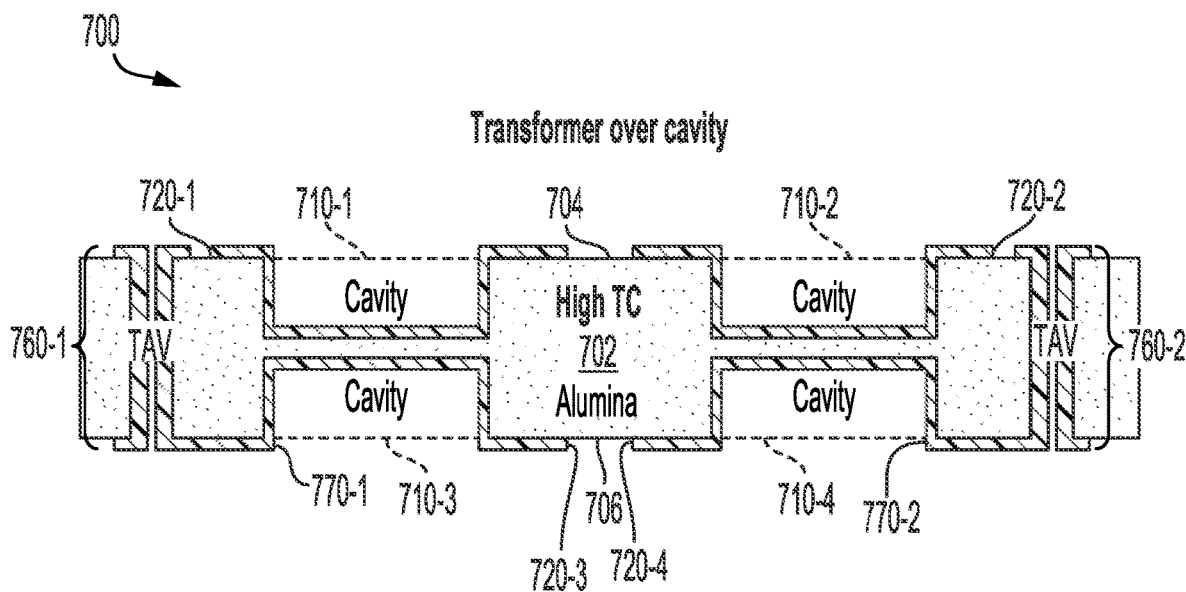
FIGS. 7A and 7B are block diagrams illustrating integrated passive devices (IPDs) formed from inductive device structures including a transformer formed from inductors, according to aspects of the present disclosure.
Figure 7B:
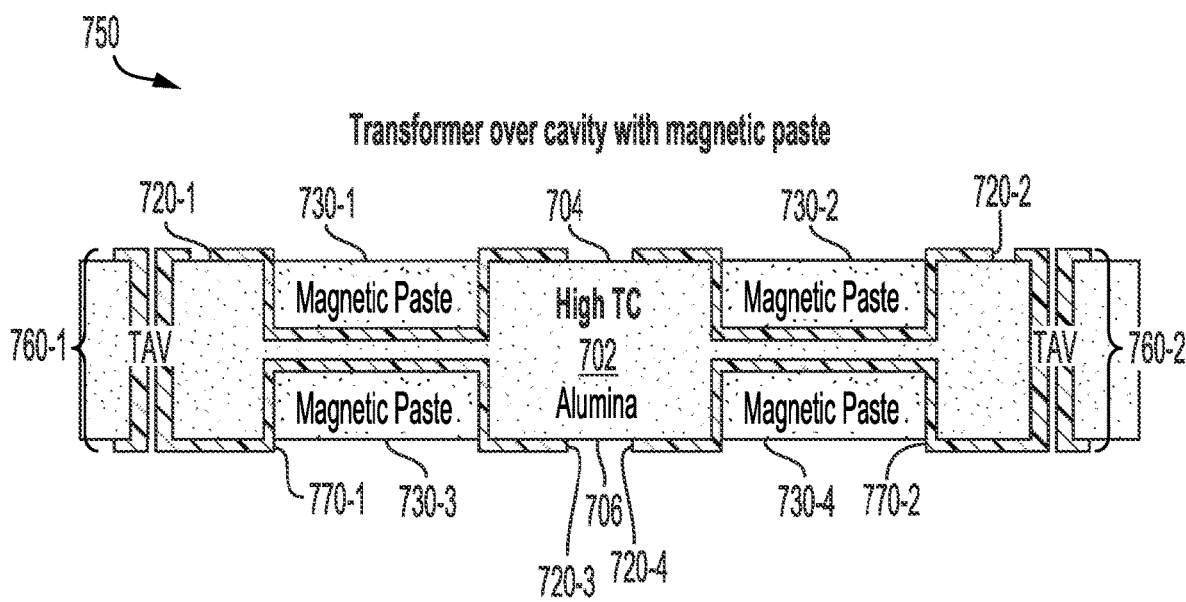

FIGS. 7A and 7B are block diagrams illustrating integrated passive devices (IPDs) formed from inductive device structures including a transformer formed from inductors, according to aspects of the present disclosure. As shown in FIG. 7A, an IPD 700 includes a double-sided substrate 702 having a first cavity 710-1, in which a first inductor 720-1 is formed, as well as a first surface 704 of the double-sided substrate 702. In addition, the double-sided substrate 702 includes a second cavity 710-2, in which a second inductor 720-2 is formed. In some aspects of the present disclosure, the first inductor 720-1 and the second inductor 720-2 are also composed of a redistribution layer (RDL) built on the first surface 704 of the double-sided substrate 702, the first cavity 710-1, and the second cavity 710-2.

As shown in FIG. 7A, a second surface 706 of the double-sided substrate 702 includes a third cavity 710-3, in which a third inductor 720-3 is formed. In addition, the double-sided substrate 702 includes a fourth cavity 710-4, in which a fourth inductor 720-4 is formed. In some aspects of the present disclosure, the third inductor 720-3 and the fourth inductor 720-4 are also composed of an RDL built on the second surface 706 of the double-sided substrate 702, the third cavity 710-3, and the fourth cavity 710-4.

In some aspects of the present disclosure, the double-sided substrate 702 includes a first via 760-1 (e.g., a first through alumina via (TAV)) and a second via 760-2 (e.g., a second TAV). In this aspect of the present disclosure, the first via 760-1 is coupled to the third inductor 720-3 to form a first portion (e.g., 770-1) of a transformer 770. In addition, the second via 760-2 is coupled to the fourth inductor 720-4 to form a second portion (770-2) of the transformer 770. In this example, the double-sided substrate 702 is composed of a double-sided, blind cavity alumina (BCA) substrate.

As shown in FIG. 7B, an IPD 750 also includes the double-sided substrate 702 having the first cavity 710-1, in which the first inductor 720-1 is formed, and the second cavity 710-2, in which the second inductor 720-2 is formed, as well as the first surface 704 of the double-sided substrate 702. In addition, the double-sided substrate 702 includes the third cavity 710-3, in which the third inductor 720-3 is formed, and the fourth cavity 710-4, in which the fourth inductor 720-4 is formed, as well as the second surface 706 of the double-sided substrate 702. In this example, the first cavity 710-1 is filled with a first magnetic paste 730-1, and the second cavity 710-2 is filled with a second magnetic paste 730-2. The third cavity 710-3 is filled with a third magnetic paste 730-3, and the fourth cavity 710-4 is filled with a fourth magnetic paste 730-4. The first magnetic paste 730-1, the second magnetic paste 730-2, the third magnetic paste 730-3, and the fourth magnetic paste 730-4 may be composed of magnetic paste material. The double-sided substrate 702 also includes the first via 760-1 and the second via 760-2. The first via 760-1 is coupled to the third inductor 720-3 to form the first portion 770-1 of the transformer 770. In addition, the second via 760-2 is also coupled to the fourth inductor 720-4 to form the second portion 770-2 of the transformer 770.

Figure 8A:
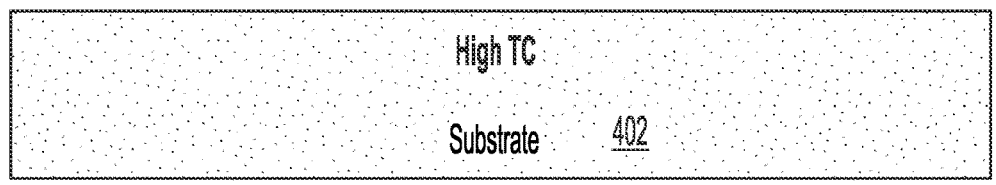
FIGS. 8A-8N are block diagrams illustrating a process of fabricating the integrated passive devices (IPDs) of FIGS. 6A and 6B, according to aspects of the present disclosure.
Figure 8B:
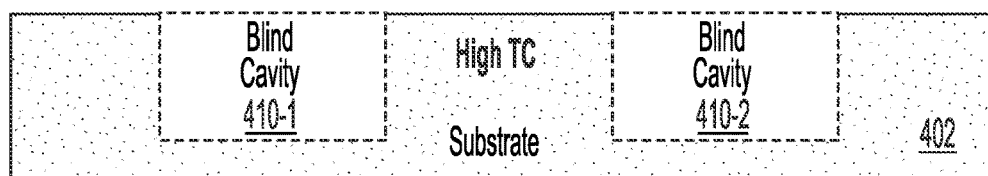
Figure 8C:
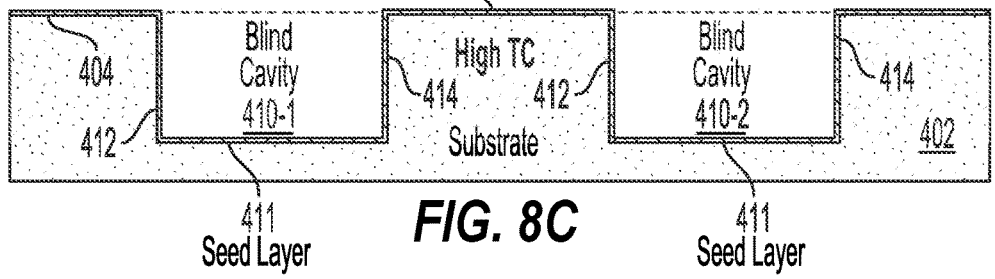
Figure 8D:
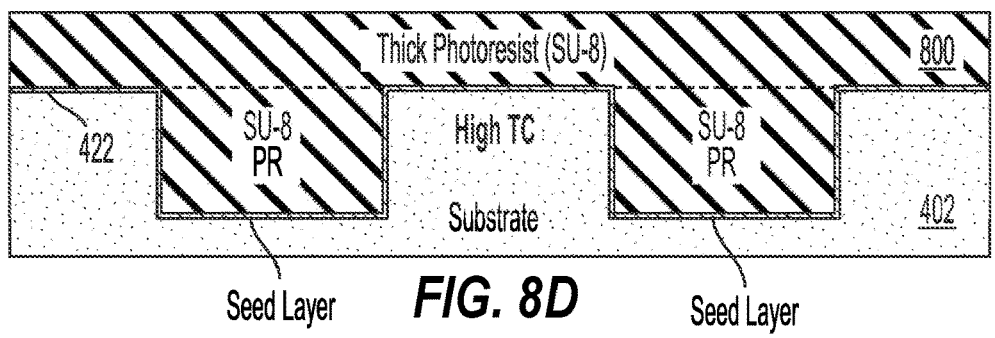
Figure 8E:
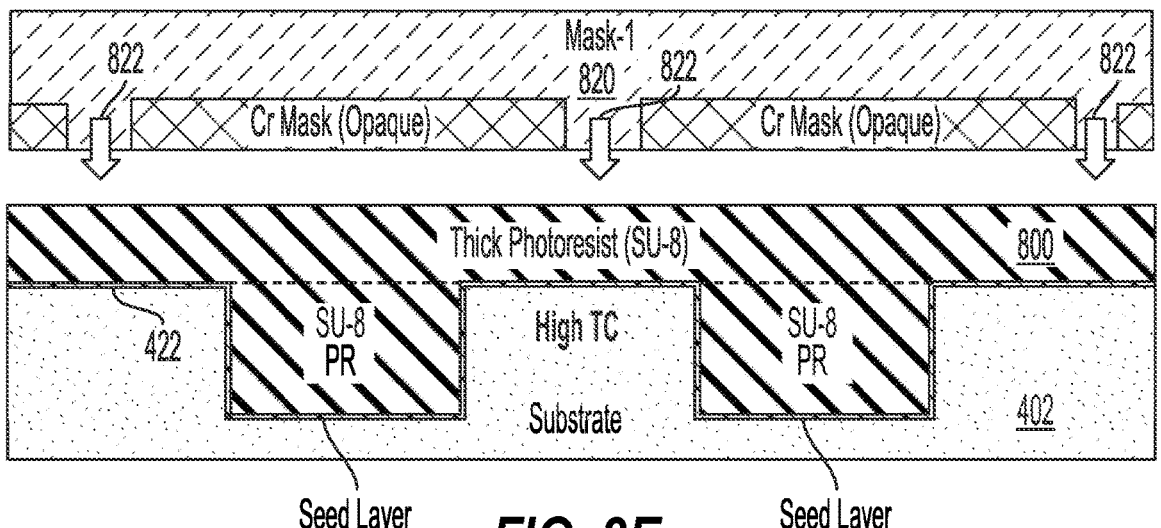
Figure 8F:
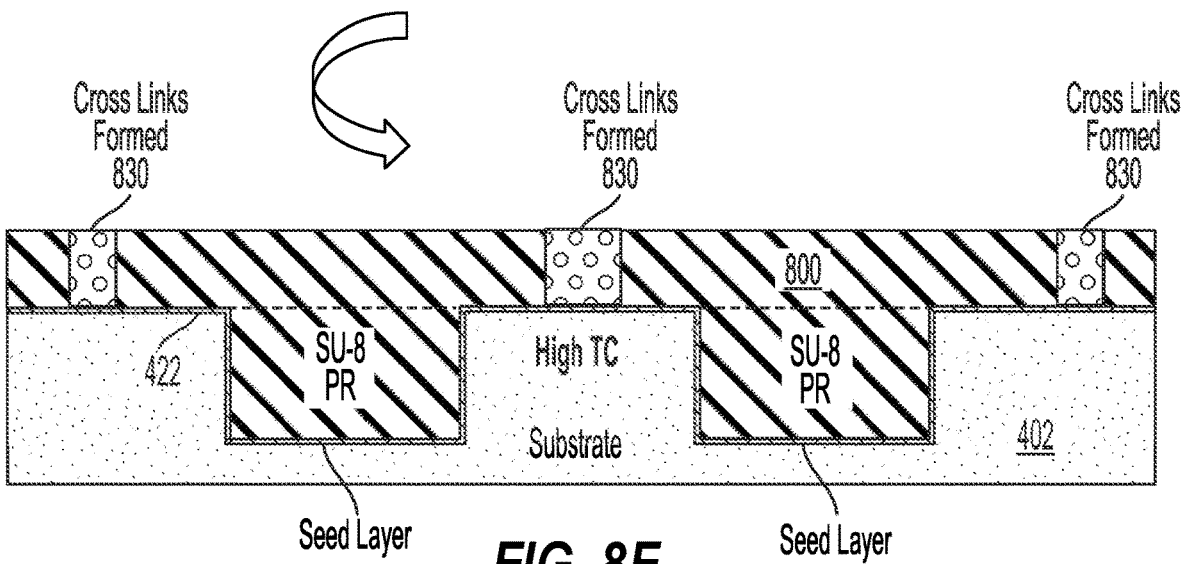
Figure 8G:
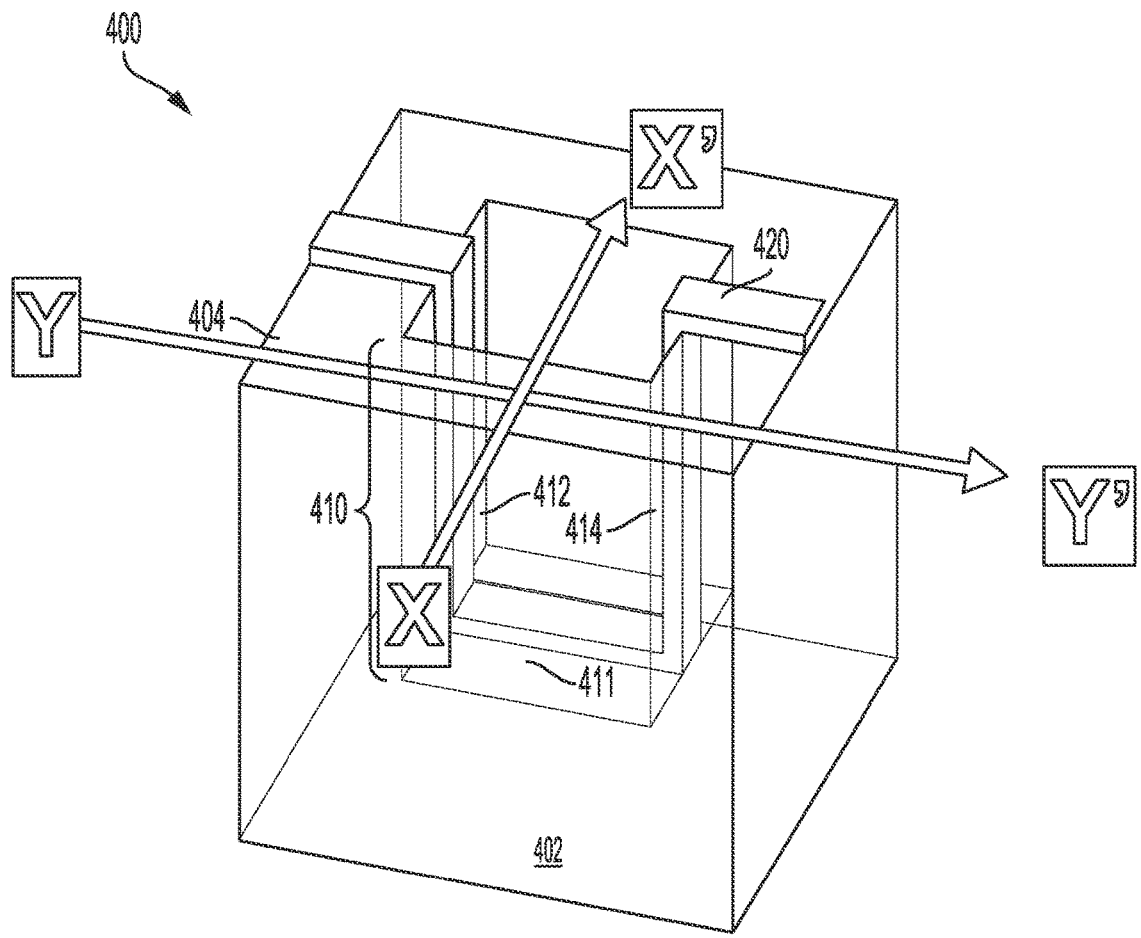
Figure 8H:
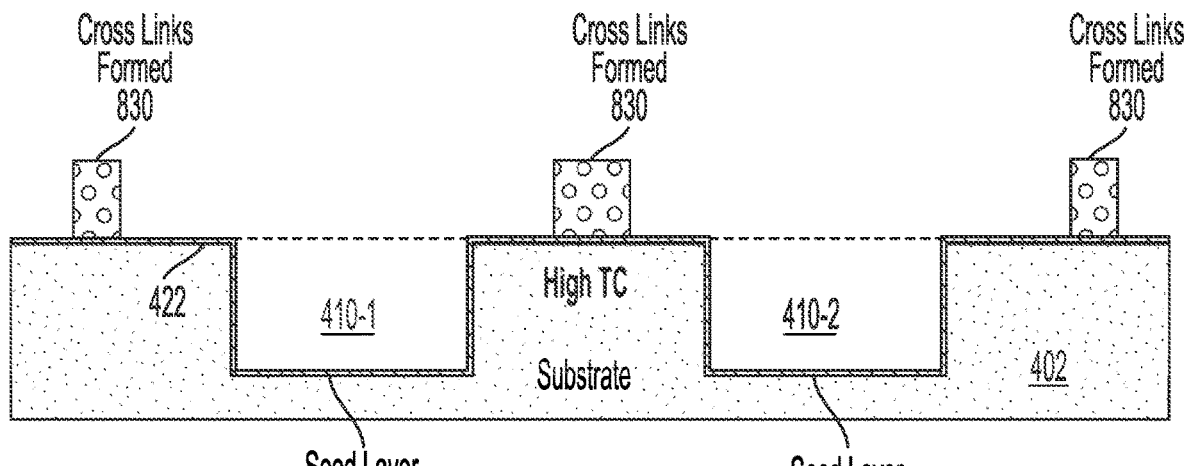
Figure 8I:
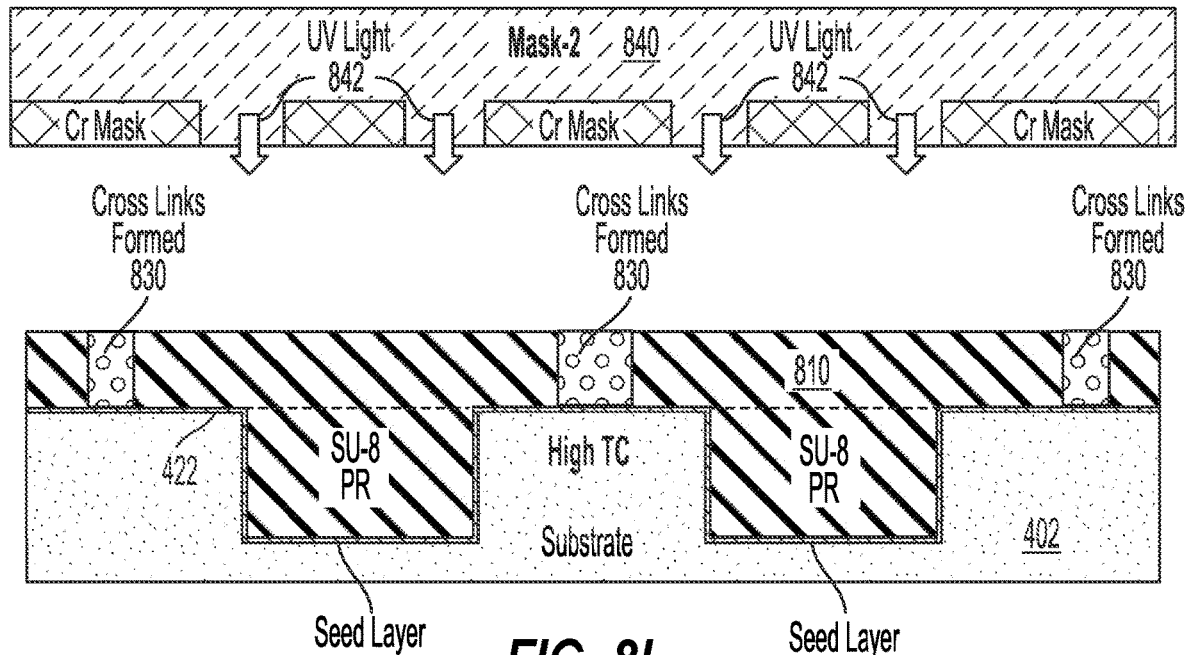
Figure 8J:
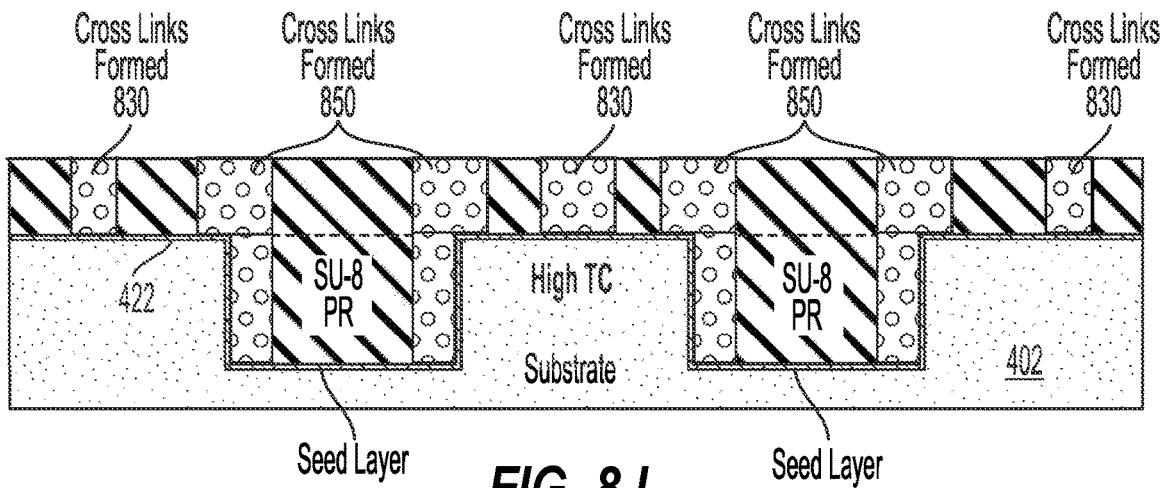
Figure 8K:
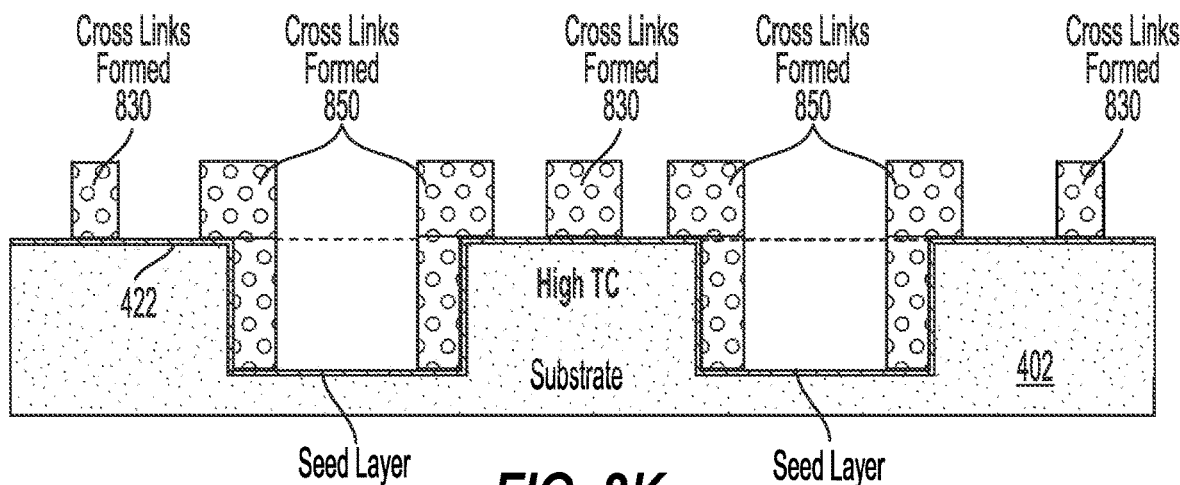
Figure 8L:
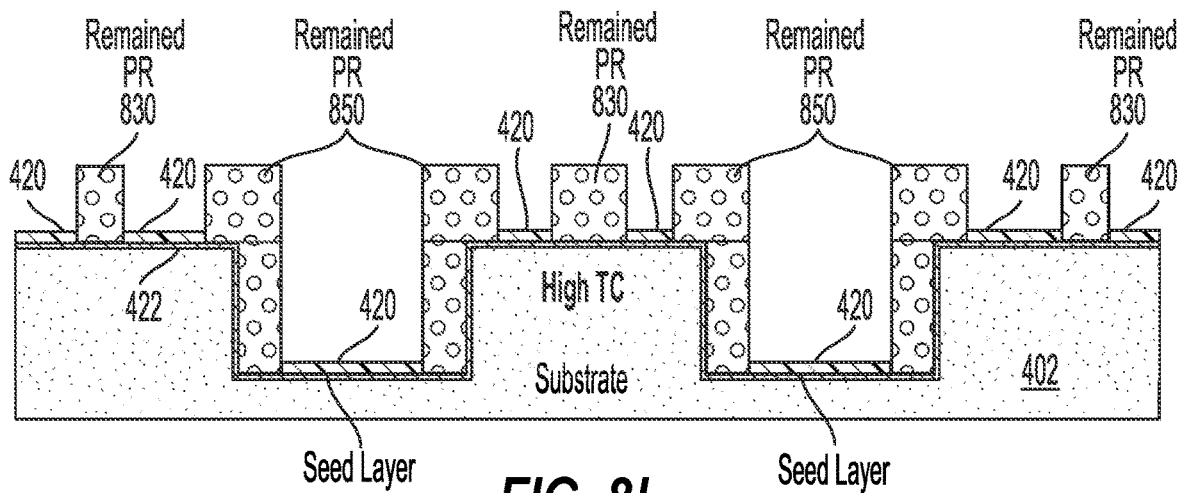
Figure 8M:
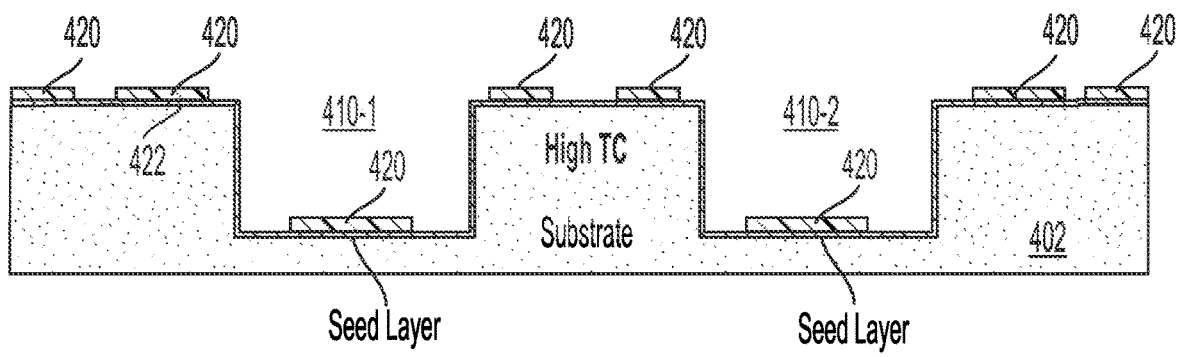
Figure 8N:
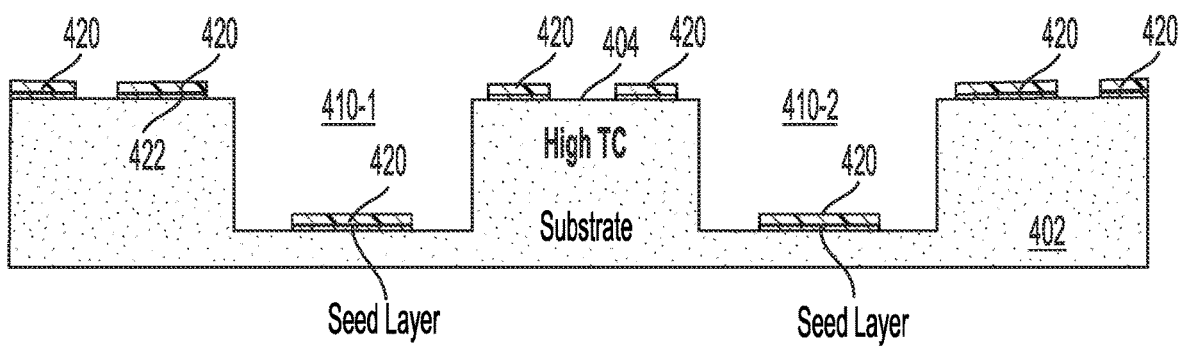

FIGS. 8A-8N are block diagrams illustrating a process of fabricating the integrated passive devices (IPDs) of FIGS. 6A and 6B, according to aspects of the present disclosure. As shown in FIG. 8A, at step 801, the substrate 402 is prepared for fabrication of the IPDs of FIGS. 6A and 6B. In this example, the substrate 402 is shown as a high thermal conductivity (TC) alumina substrate.

As shown in FIG. 8B, at step 802, the first cavity 410-1 and the second cavity 410-2 are formed in the substrate 402 using, for example, an ablation laser, or other like cavity formation process. In this example, the first cavity 410-1 and the second cavity 410-2 are shown as having a rectangular shape, as opposed to the square shape of the cavity 410 shown in FIGS. 4A and 4B.

As shown in FIG. 8C, at step 803, a seed layer 422 is deposited on the surface 404 of the substrate 402, as well as the sidewalls 412, 414 and the base 411 of the first cavity 410-1 and the second cavity 410-2. In this example, the seed layer 422 is deposited through a physical vapor deposition process, although other deposition processes are possible for formation of the seed layer 422.

As shown in FIG. 8D, at step 804, a photoresist 800 is deposited on the seed layer 422 on the surface 404 of the substrate 402, as well as the seed layer 422 on the sidewalls 412, 414 and the base 411 of the first cavity 410-1 and the second cavity 410-2. In some aspects of the present disclosure, the photoresist 800 is composed of an epoxy-based negative photoresist material, such as an SU-8 photoresist material, deposited through a spin-coating process, similar to the SU-8 photoresist that is widely used in micro-electromechanical system (MEMS) process.

As shown in FIG. 8E, at step 805A, a first step of a two-step photolithography technique is applied to the photoresist 800 using a first mask 820. In this example, the first mask 820 is shown as an opaque, chromium (Cr) mask, having openings 822 through which the photoresist 800 is exposed to ultraviolet (UV) light.

As shown in FIG. 8F, at step 806A, cross links 830 are formed from exposure of the photoresist 800 to the UV light through the openings 822 of the first mask 820. As shown in FIG. 8H, at step 807A, a post exposure and bake (PEB) process is performed and developed to strip the photoresist 800. Once the photoresist 800 is stripped, a pattern of the cross links 830 is formed on the seed layer 422 on the surface 404 of the substrate 402. The examples in FIG. 8A-8H are shown from the perspective of an X-X' view shown in the integrated passive device (IPD) 400 of FIG. 8G. The examples in FIGS. 8I-8L are shown from the perspective of a Y-Y' view shown in the IPD 400 of FIG. 8G.

As shown in FIG. 8I, at step 805B, a second step of the two-step photolithography technique is applied to the photoresist 800 using a second mask 840, in which the photoresist 800 includes the pattern of cross links 830, as shown in FIG. 8F. In this example, the second mask 840 is also shown as an opaque, Cr mask, having openings 842 through which the photoresist 800 is exposed to UV light.

As shown in FIG. 8J, at step 806B, cross links 850 are formed from exposure of the photoresist 800 to the UV light through the openings 842 of the second mask 840. As shown in FIG. 8K, at step 807B, the PEB process is performed and developed to strip the photoresist 800. Once the photoresist 800 is stripped, a pattern of the cross links 850 is formed on the seed layer 422 on the surface 404 of the substrate 402 to expose a pattern of the seed layer 422.

As shown in FIG. 8L, at step 808, a copper (Cu) redistribution layer (RDL) plating is performed on the portions of the seed layer 422 exposed by the patterns of the cross links 830 and 850, shown as portions of the inductor 420. As shown in FIG. 8M, at step 809, the patterns of the cross links 830 and 850 are removed to expose portions of the seed layer 422. As shown in FIG. 8N, at step 810, the seed layer 422 is removed to expose portions of the surface 404 of the substrate 402. The examples shown in FIGS. 9A-9J continue illustration of the formation process of the IPDs of FIGS. 6A and 6B, as shown from the perspective of the X-X' view shown in the IPD 400 of FIG. 8G.

Figure 9A:
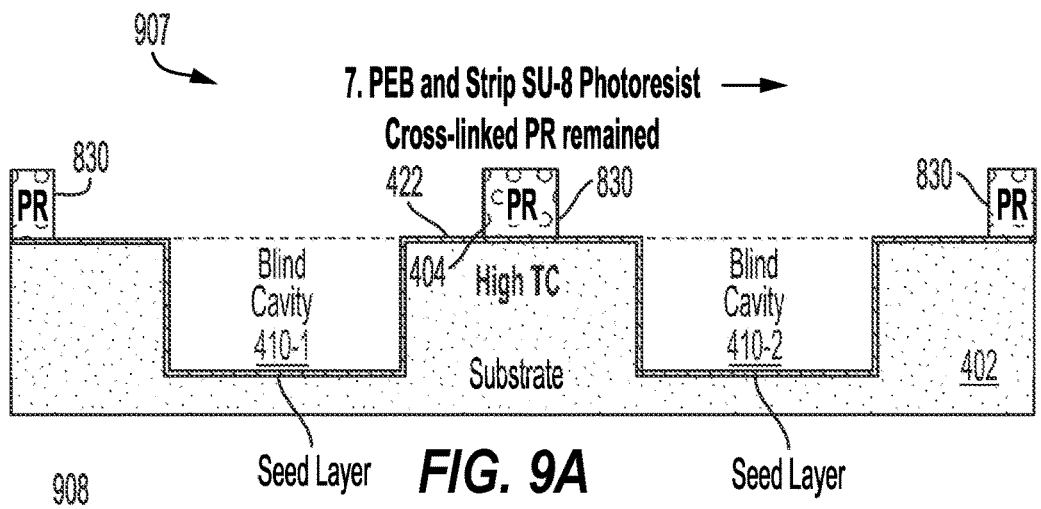
FIGS. 9A-9J are block diagrams further illustrating the process of fabricating the integrated passive devices (IPDs) of FIGS. 6A and 6B, according to aspects of the present disclosure.

FIGS. 9A-9J are block diagrams further illustrating the process of fabricating the integrated passive devices (IPDs) of FIGS. 6A and 6B, according to aspects of the present disclosure. As shown in FIG. 9A, at step 907, a post exposure and bake (PEB) process is performed to strip the photoresist 800 of FIG. 8D. Once the photoresist 800 is stripped, the pattern of the cross links 830 is formed on the seed layer 422 on the surface 404 of the substrate 402.

Figure 9B:
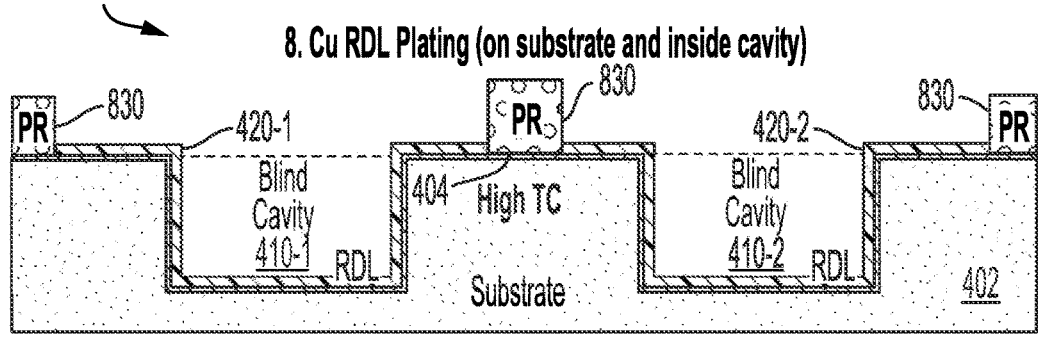
Figure 9C:
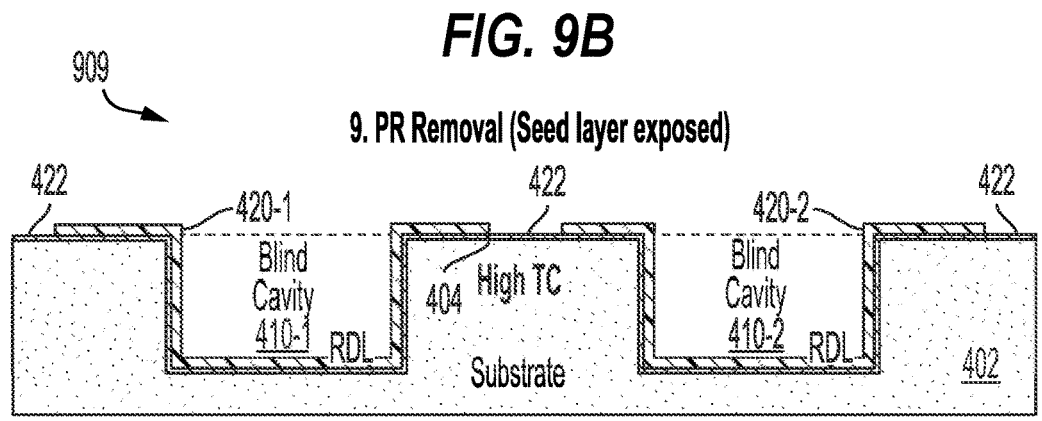
Figure 9D:
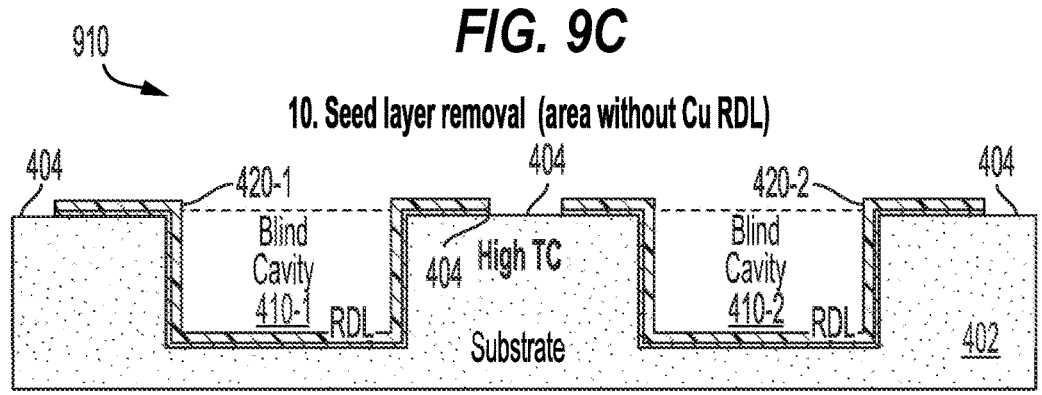

As shown in FIG. 9B, at step 908, a copper (Cu) redistribution layer (RDL) plating is performed on the portions of the seed layer 422 exposed by the pattern of the cross links 830, shown as portions of the inductor 420. As shown in FIG. 9C, at step 909, the pattern of the cross links 830 is removed to expose portions of the seed layer 422. As shown in FIG. 9D, at step 910, the seed layer 422 is removed to expose portions of the surface 404 of the substrate 402.

Figure 9E:
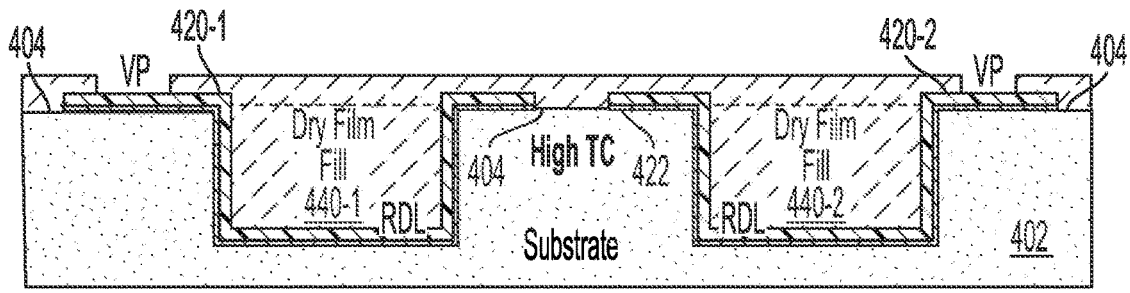

As shown in FIG. 9E, at step 911A, a first dry film fill 440-1 and a second dry film fill 440-2 are deposited in the first cavity 410-1 and the second cavity 410-2 of the substrate 402. The first dry film fill 440-1 and second dry film fill 440-2 are also deposited on the first inductor 420-1 and the second inductor 420-2, respectively, and the exposed portions of the surface 404 of the substrate 402. In some aspects of the present disclosure, the first dry film fill 440 (e.g., 440-1 and 440-2) is composed of a polyimide (PI) with high thermal conductivity (TC) fillers (e.g., aluminum nitride (AlN), aluminum oxide (Al2O3) nano-particle powder, etc.). In addition, via pad (VP) openings are formed in the first dry film fill 440-1 and second dry film fill 440-2 to expose a portion of the first inductor 420-1 and a portion of the second inductor 420-2.

Figure 9F:
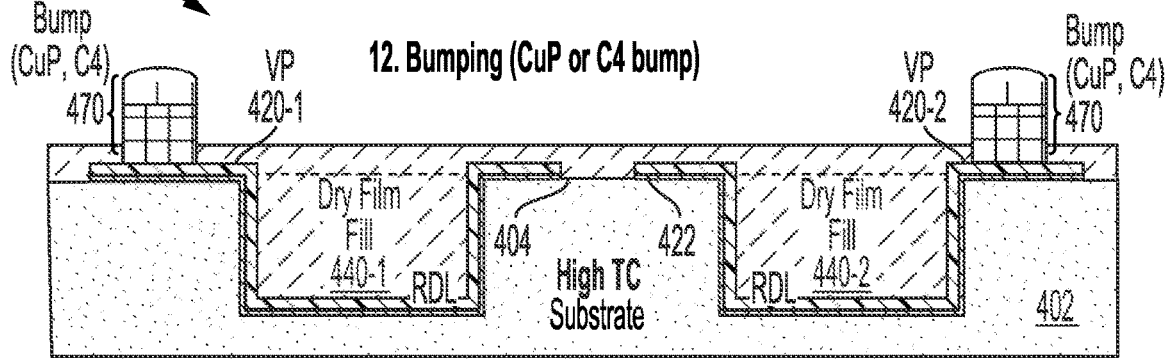
Figure 9G:
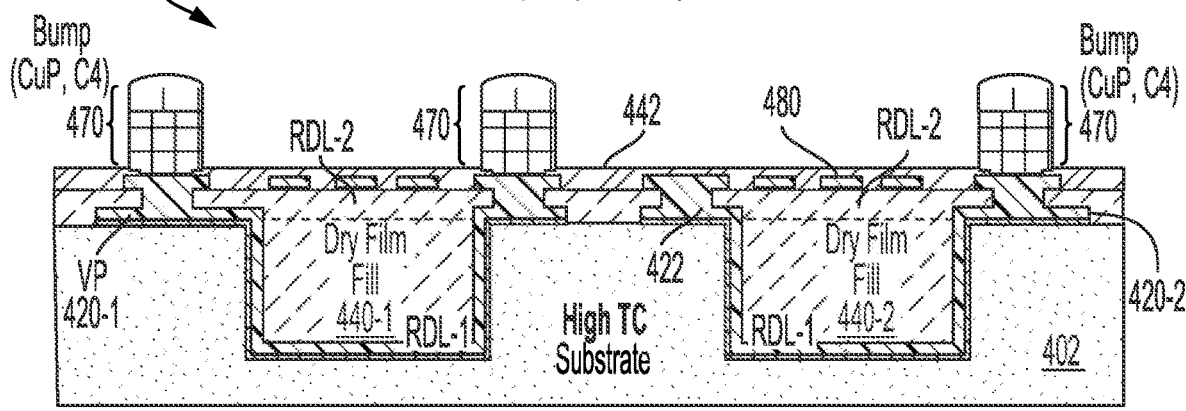
Figure 9H:
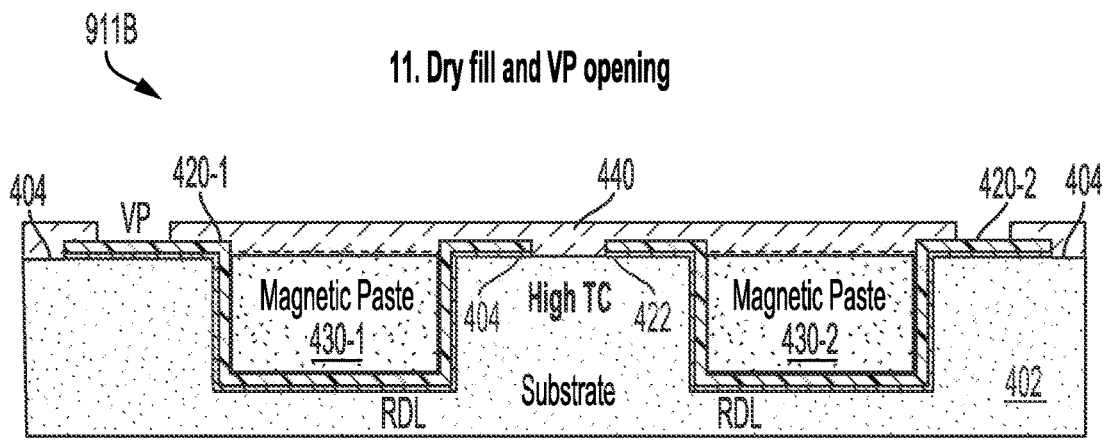
Figure 9I:
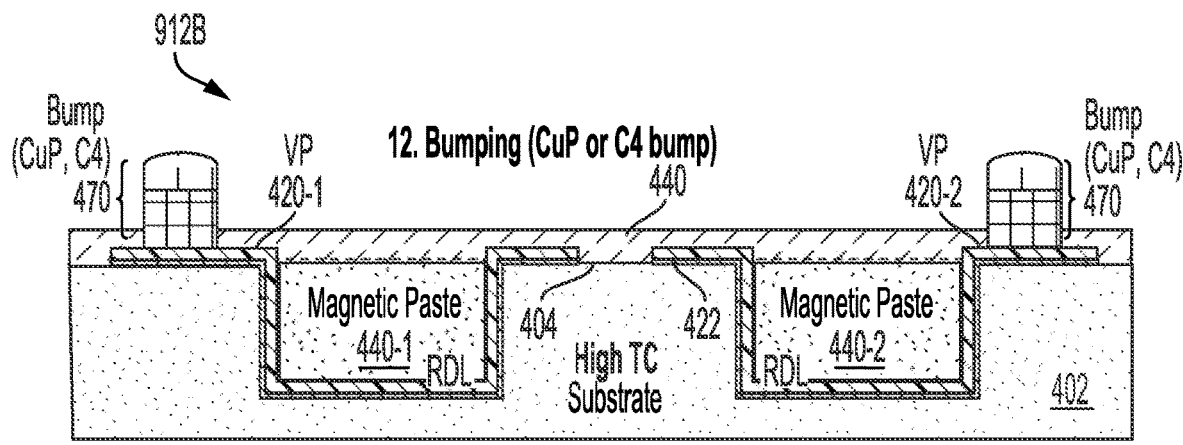
Figure 9J:
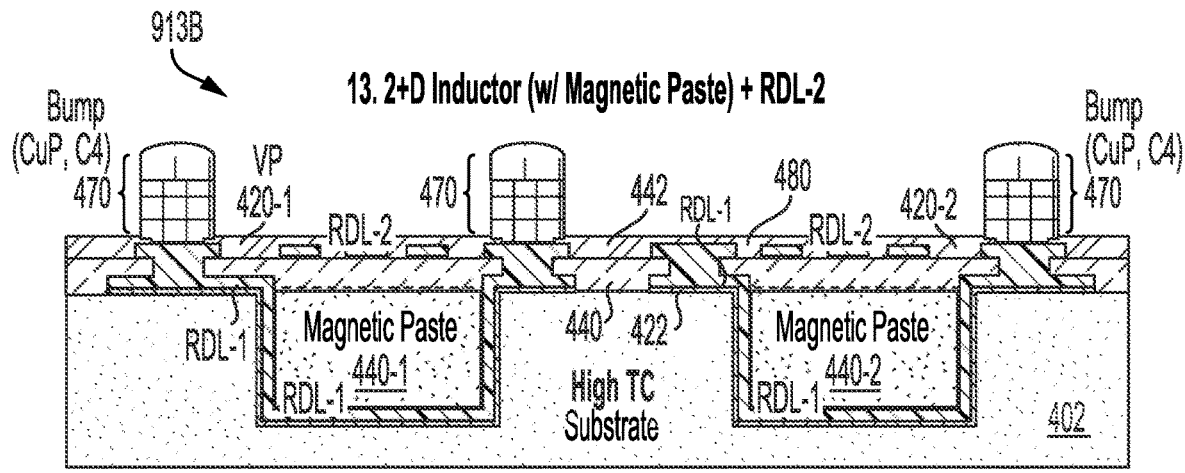

As shown in FIG. 9F, at step 912A, conductive interconnects 470 are formed on the exposed portions of the surface 404 of the substrate 402. In some aspects of the present disclosure, the conductive interconnects 470 are composed of conductive bumps, copper pillars, C4 bumps, or other like conductive interconnects. As shown in FIG. 9G, a second redistribution layer (RDL) 480 is deposited on the surface of the first dry film fill 440 (e.g., 440-1 and 440-2). In addition, an interlayer dielectric (ILD) layer 442 is deposited on the second RDL 480 (e.g., RDL-2). FIGS. 9H-9J further illustrate formation of the IPD 650 of FIG. 6B.

As shown in FIG. 9H, at step 911B, the first magnetic paste 430-1 and the second magnetic paste 430-2 are deposited in the first cavity 410-1 and the second cavity 410-2 of the substrate 402. In addition, the first dry film fill 440-1 and second dry film fill 440-2 are deposited on exposed portions of the first inductor 420-1, the second inductor 420-2, and the exposed portions of the surface 404 of the substrate 402. In some aspects of the present disclosure, the first magnetic paste 430-1 and the second magnetic paste 430-2 are composed of Ajinomoto magnetic paste (AMP) or other like magnetic paste material. In addition, via pad (VP) openings are formed in the first dry film fill 440-1 and the second dry film fill 440-2 to expose a portion of the first inductor 420-1 and a portion of the second inductor 420-2.

As shown in FIG. 9I, at step 912B, conductive interconnects 470 are formed on the exposed portions of the surface 404 of the substrate 402. In some aspects of the present disclosure, the conductive interconnects 470 are composed of conductive bumps, copper pillar bumps, C4 bumps, solder balls, or other like conductive interconnects. As shown in FIG. 9J, a copper (Cu) redistribution layer (RDL-2) 480 is deposited on the surface of the first dry film fill 440-1 and the second dry film fill 440-2. In addition, the interlayer dielectric (ILD) layer 442 is deposited on the RDL-2 480. A process for fabricating an integrated passive device having an inductive device structure is shown in FIG. 10.

Figure 10:
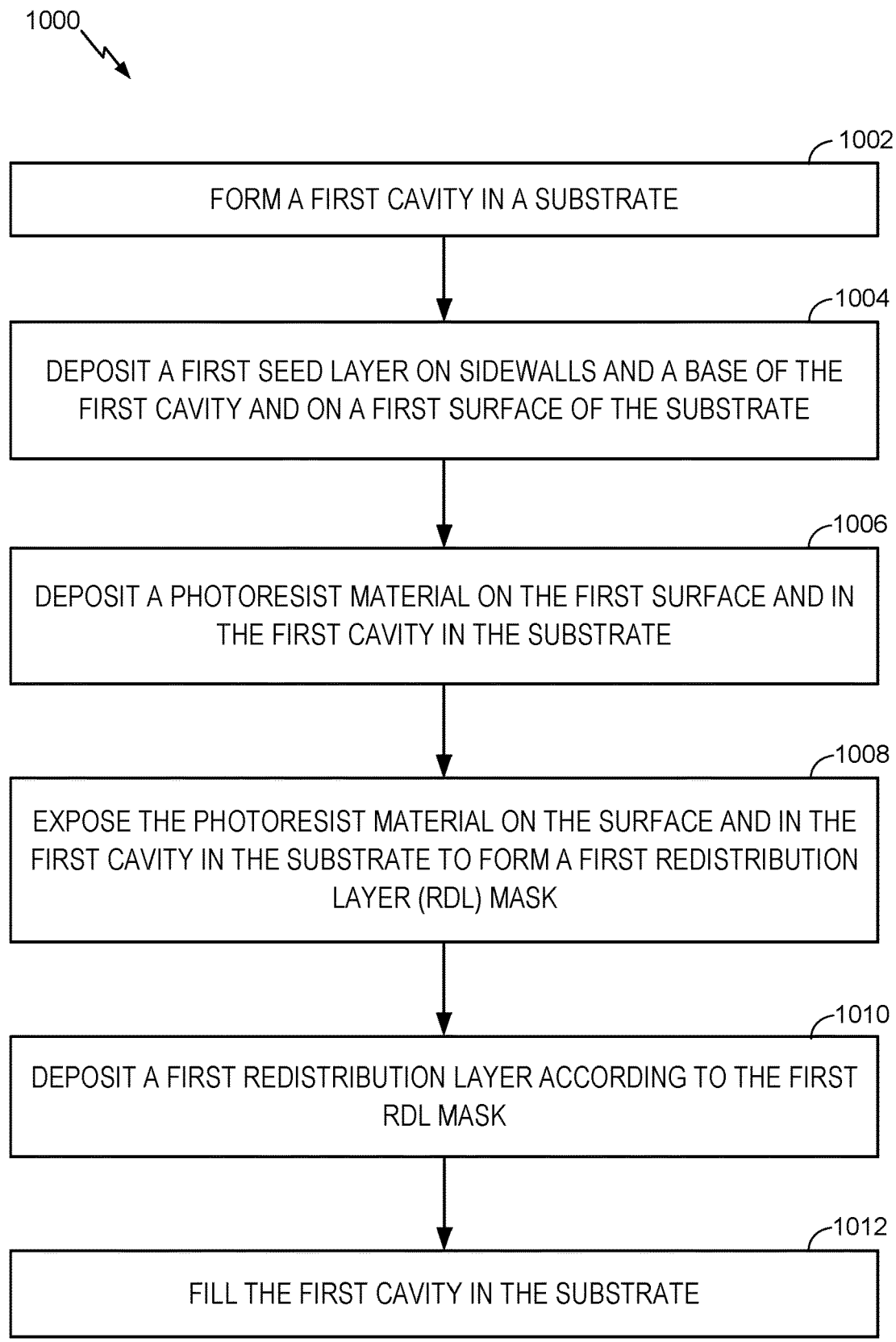
FIG. 10 is a process flow diagram illustrating a method for fabricating an integrated passive device having an inductive device structure, according to aspects of the present disclosure.

FIG. 10 is a process flow diagram illustrating a method for fabricating an integrated passive device having an inductive device structure, according to aspects of the present disclosure. A method 1000 begins in block 1002, in which a first cavity is formed in a substrate. For example, as shown in FIG. 8B, at step 802, the first cavity 410-1 and the second cavity 410-2 are formed in the substrate 402 using, for example, an ablation laser, or other like cavity formation process. In this example, the first cavity 410-1 and the second cavity 410-2 are shown as having a rectangular shape, as opposed to the square shape of the cavity 410 shown in FIGS. 4A and 4B.

In block 1004, a first seed layer is deposited on sidewalls and a base of the first cavity and on a first surface of the substrate. For example, as shown in FIG. 8C, at step 803, a seed layer 422 is deposited on the surface 404 of the substrate 402, as well as the sidewalls 412, 414 and the base 411 of the first cavity 410-1 and the second cavity 410-2. In this example, the seed layer 422 is deposited through a physical vapor deposition process, although other deposition processes are possible for formation of the seed layer 422. As shown in FIG. 7A, a second seed layer may be deposited on the sidewalls and the base of a second cavity (e.g., 710-3/710-4) on the second surface 706 of the double-sided substrate 702.

Referring again to FIG. 10, at block 1006, a photoresist material is deposited on the first surface and in the first cavity in the substrate. For example, as shown in FIG. 8D, at step 804, a photoresist 800 is deposited on the seed layer 422 on the surface 404 of the substrate 402, as well as the seed layer 422 on the sidewalls 412, 414 and the base 411 of the first cavity 410-1 and the second cavity 410-2. In some aspects of the present disclosure, the photoresist 800 is composed of an epoxy-based negative photoresist material, such as an SU-8 photoresist material, deposited through a spin-coating process, similar to the SU-8 photoresist that is widely used in micro-electro-mechanical system (MEMS) process.

At block 1008, the photoresist material on the first surface and in the first cavity in the substrate is exposed to form a first redistribution layer (RDL) mask. For example, as shown in FIG. 8E, at step 805A, a two-step photolithography technique is applied to the photoresist 800 using the first mask 820. As shown in FIG. 8F, at step 806A, the cross links 830 are formed from exposure of the photoresist 800 to the UV light through the openings 822 of the first mask 820. As shown in FIG. 8H, at step 807A, the post exposure and bake (PEB) process is performed to strip the photoresist 800. Once the photoresist 800 is stripped, a pattern of the cross links 830 is formed on the seed layer 422 on the surface 404 of the substrate 402, which may be referred to as an RDL pattern.

At block 1010, a first conductive material is deposited according to the first RDL mask to form a first RDL on the sidewalls and the base of the first cavity in the substrate and on the first surface of the substrate. For example, as shown in FIG. 9B, at step 908, a copper (Cu) RDL plating is performed on the portions of the seed layer 422 exposed by the pattern of the cross links 830. As shown in FIG. 9C, at step 909, the pattern of the cross links 830 is removed to expose portions of the seed layer 422. As shown in FIG. 9D, at step 910, the seed layer 422 is removed to expose portions of the surface 404 of the substrate 402. As shown in FIG. 7A, a second conductive material is deposited according to a second RDL mask for form a second RDL (e.g., 720-3/720-4) on the sidewalls and the base of a second cavity (e.g., 710-3/710-4) on the second surface 706 of the double-sided substrate 702.

At block 1012, the first cavity in the substrate is filled. For example, as shown in FIG. 9E, at step 911A, a first dry film fill 440-1 and a second dry film fill 440- are deposited in the first cavity 410-1 and the second cavity 410-2, respectively, of the substrate 402. The first dry film fill 440-1 and the second dry film fill 440-2 are also deposited on the first inductor 420-1, the second inductor 420-2, and the exposed portions of the surface 404 of the substrate 402. In some aspects of the present disclosure, the first dry film fill 440-1 and the second dry film fill 440-2 are composed of a polyimide (PI) with high thermal conductivity (TC) fillers (e.g., AlN, Al2O3 nano-particle powder, etc.). In addition, via pad (VP) openings are formed in the first dry film fill 440-1 and the second dry film fill 440-2 to expose a portion of the first inductor 420-1 and a portion of the second inductor 420-2.

Some aspects of the present disclosure are directed to inductive device structures, including a redistribution layer (RDL) on a surface and in the cavity of a substrate. In some aspects of the present disclosure, the substrate is composed of a blind cavity alumina (BCA) substrate, supporting an RDL formed by depositing a thick copper layer directly built on the BCA substrate with high thermal conductivity. In these aspects of the present disclosure, the inductive device structure enables formation of an inductor having both a higher Q-factor and inductance density to support a higher power handling capability when implemented in integrated passive device (IPD) filters. According to aspects of the present disclosure, an RFFE module includes an IPD filter implemented using the inductive device structure.

According to a further aspect of the present disclosure, a device includes a means conducting on sidewalls and a base of a first cavity in a substrate and on a first surface of the substrate. In one configuration, the conducting means may be the inductor 420, as shown in FIGS. 4A and 4B. In another aspect, the aforementioned means may be any structure or any material configured to perform the functions recited by the aforementioned means. (Completed after claim language approval).

Figure 11:
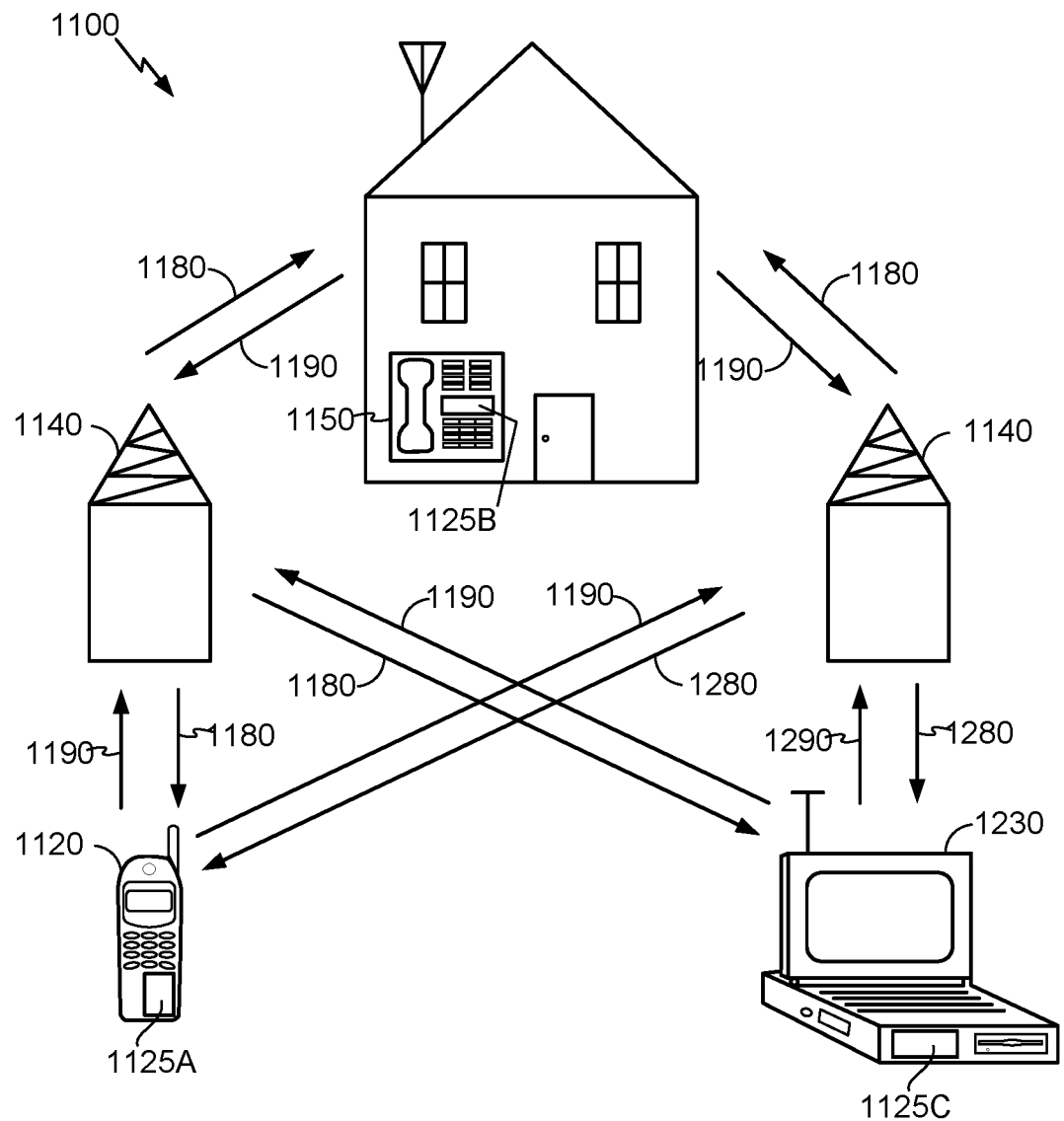
FIG. 11 is a block diagram showing an exemplary wireless communications system in which an aspect of the present disclosure may be advantageously employed.

FIG. 11 is a block diagram showing an exemplary wireless communications system 1100 in which an aspect of the present disclosure may be advantageously employed. For purposes of illustration, FIG. 11 shows three remote units 1120, 1130, and 1150 and two base stations 1140. It will be recognized that wireless communications systems may have many more remote units and base stations. Remote units 1120, 1130, and 1150 include integrated circuit (IC) devices 1125A, 1125C, and 1125B that include the disclosed inductive device structure. It will be recognized that other devices may also include the disclosed inductive device structure, such as the base stations, switching devices, and network equipment. FIG. 11 shows forward link signals 1180 from the base station 1140 to the remote units 1120, 1130, and 1150, and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 11 illustrates remote units according to the aspects of the present disclosure, the present disclosure is not limited to these exemplary illustrated units. Aspects of the present disclosure may be suitably employed in many devices, which include the disclosed inductive device structure.

Figure 12:
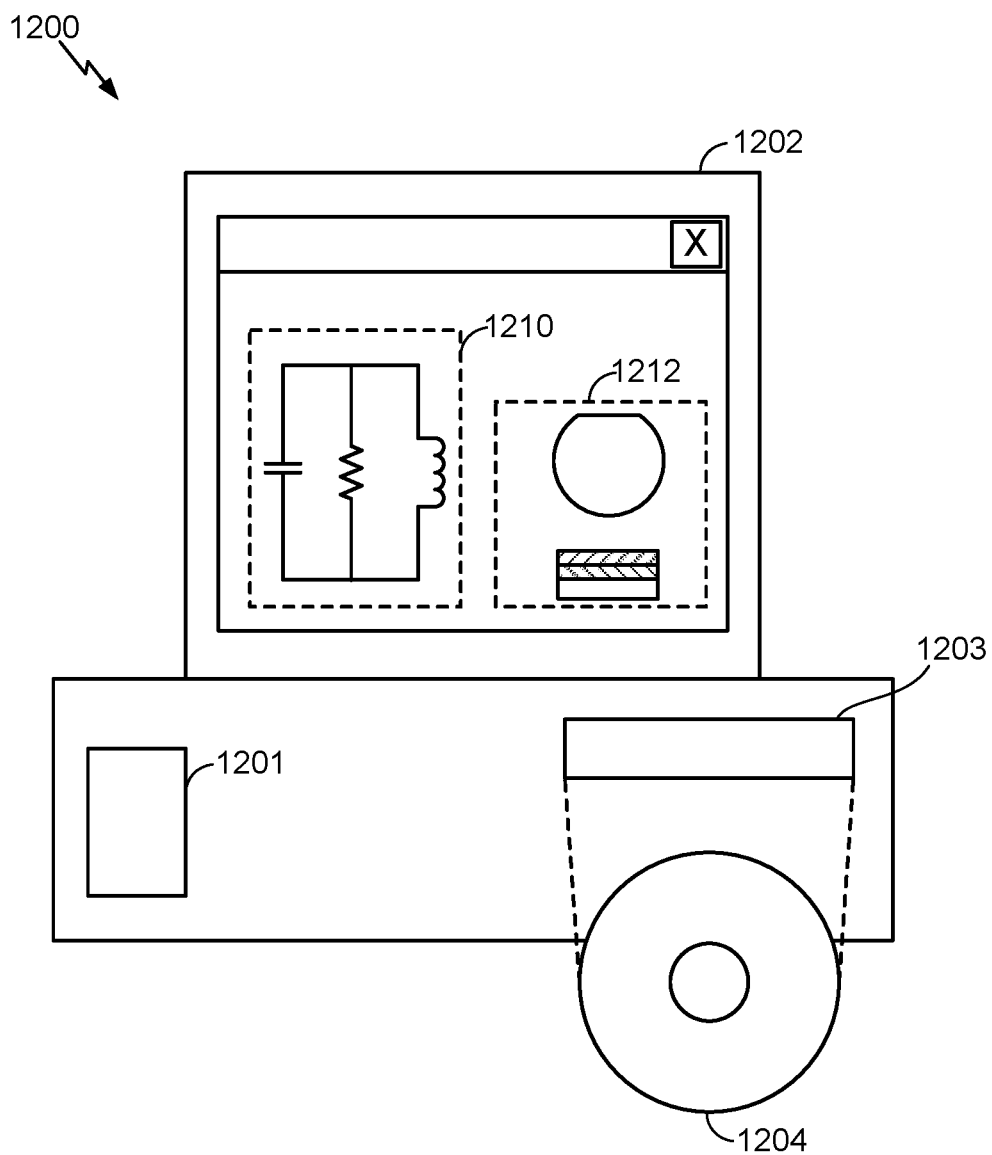
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the inductive device structure disclosed above. A design workstation 1200 includes a hard disk 1201 containing operating system software, support files, and design software such as Cadence or OrCAD. The design workstation 1200 also includes a display 1202 to facilitate design of a circuit 1210 or a radio frequency (RF) component 1212 such as an RDL substrate. A storage medium 1204 is provided for tangibly storing the design of the circuit 1210 or the RF component 1312 (e.g., the inductive device structure). The design of the circuit 1210 or the RF component 1212 may be stored on the storage medium 1204 in a file format such as GDSII or GERBER. The storage medium 1204 may be a compact disc read-only memory (CD-ROM), digital versatile disc (DVD), hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the RF component 1212 by decreasing the number of processes for designing semiconductor wafers.

Implementation examples are described in the following numbered clauses:

1. A device, comprising:
   a substrate;
   a first redistribution layer (RDL) on sidewalls and a base of a first cavity in the substrate and on a first surface of the substrate; and
   a fill material in the first cavity.
2. The device of clause 1, further comprising:
   a second redistribution layer (RDL) on sidewalls and a base of a second cavity in the substrate and on a second surface opposite the first surface of the substrate;
   the fill material in the second cavity; and
   a through via extending from the first surface to the second surface of the substrate and coupled to the second RDL.
3. The device of any of clauses 1 or 2, in which the first RDL is on opposing sidewalls of the first cavity and a width of the first RDL is less than a width of the first cavity.
4. The device of any of clauses 1-3, in which a portion of the first RDL on the base of the first cavity is diagonally disposed on the base of the first cavity.
5. The device of any of clauses 1-4, further comprising conductive interconnects coupled to a portion of the first RDL on the first surface of the substrate.
6. The device of any of clauses 1-5, in which the fill material comprises a magnetic paste or a dry film.

7. The device of any of clauses 1-6, in which the substrate comprises alumina, glass, gallium arsenide, high resistivity silicon, and/or a laminate material.
8. The device of any of clauses 1-7, in which the device is integrated in an integrated passive device (IPD).
9. The device of clause 8, in which the IPD is integrated in a radio frequency (RF) filter.
10. The device of clause 8, in which the IPD is integrated in a radio frequency (RF) front-end (RFFE) module.
11. A method for fabricating a device, comprising:
forming a first cavity in a substrate;
depositing a first seed layer on sidewalls and a base of the first cavity and on a first surface of the substrate;
depositing a photoresist material on the first surface and in the first cavity in the substrate;
exposing the photoresist material on the first surface and in the first cavity in the substrate to form a first redistribution layer (RDL) mask;
depositing a first conductive material according to the first RDL mask to form a first redistribution layer (RDL) on the sidewalls and the base of the first cavity in the substrate and on the first surface of the substrate; and
filling the first cavity in the substrate with a fill material.
12. The method of clause 11, further comprising:
forming a second cavity in the substrate, opposite the first cavity;
depositing a second seed layer on sidewalls and a base of the second cavity and on a second surface opposite the first surface of the substrate;
depositing the photoresist material on the second surface and in the second cavity in the substrate;
exposing the photoresist material on the second surface and in the second cavity in the substrate to form a second redistribution layer (RDL) mask;
depositing a second conductive material according to the second RDL mask to form a second redistribution layer (RDL) on the sidewalls and the base of the second cavity in the substrate and on the second surface of the substrate;
filing the second cavity in the substrate with the fill material; and
form a through via extending from the first surface to the second surface of the substrate and coupled to the second RDL.
13. The method of any of clauses 11 or 12, in which the first RDL is on opposing sidewalls of the first cavity and a width of the first RDL is less than a width of the first cavity.
14. The method of any of clauses 11-13, in which a portion of the first RDL on the base of the first cavity is diagonally disposed on the base of the first cavity.
15. The method of any of clauses 11-14, further comprising coupling conductive interconnects to a portion of the first RDL on the first surface of the substrate.
16. The method of any of clauses 11-15, in which the fill material comprises a magnetic paste or a dry film.
17. The method of any of clauses 11-16, in which the substrate comprises alumina, glass, gallium arsenide, high resistivity silicon, and/or a laminate material.
18. The method of any of clauses 11-17, further comprising integrating the device in an integrated passive device (IPD).
19. The method of clause 18, further comprising integrating the IPD in a radio frequency (RF) filter.
20. The method of clause 18, further comprising integrating the IPD in a radio frequency (RF) front-end (RFFE) module.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. A device, comprising:
   a substrate;
   a first redistribution layer (RDL) on sidewalls and a base of a first cavity in the substrate and on a first surface of the substrate; and
   a fill material in the first cavity, wherein the first RDL is on opposing sidewalls of the first cavity and a width of the first RDL is less than a width of the first cavity.

2. The device of claim 1, further comprising:
   a second redistribution layer (RDL) on sidewalls and a base of a second cavity in the substrate and on a second surface opposite the first surface of the substrate;
   the fill material in the second cavity; and
   a through via extending from the first surface to the second surface of the substrate and coupled to the second RDL.

3. The device of claim 1, in which a portion of the first RDL on the base of the first cavity is diagonally disposed on the base of the first cavity.

4. The device of claim 1, further comprising conductive interconnects coupled to a portion of the first RDL on the first surface of the substrate.

5. The device of claim 1, in which the fill material comprises a magnetic paste or a dry film.

6. The device of claim 1, in which the substrate comprises alumina, glass, gallium arsenide, high resistivity silicon, and/or a laminate material.

7. The device of claim 1, in which the device is integrated in an integrated passive device (IPD).

8. The device of claim 7, in which the IPD is integrated in a radio frequency (RF) filter.

9. The device of claim 7, in which the IPD is integrated in a radio frequency (RF) front-end (RFFE) module.

10. A device, comprising:
    a substrate;
    a first redistribution layer (RDL) on sidewalls and a base of a first cavity in the substrate and on a first surface of the substrate;

a fill material in the first cavity;
a second redistribution layer (RDL) on sidewalls and a base of a second cavity in the substrate and on a second surface opposite the first surface of the substrate;
the fill material in the second cavity; and
a through via extending from the first surface to the second surface of the substrate and coupled to the second RDL.

11. A device, comprising:
a substrate;
a first redistribution layer (RDL) on sidewalls and a base of a first cavity in the substrate and on a first surface of the substrate;
a fill material in the first cavity; and
conductive interconnects coupled to a portion of the first RDL on the first surface of the substrate.

* * * * *